US010889889B2

(12) United States Patent
Mori et al.

(10) Patent No.: US 10,889,889 B2
(45) Date of Patent: Jan. 12, 2021

(54) HIGH PURITY COPPER SPUTTERING TARGET MATERIAL

(71) Applicant: MITSUBISHI MATERIALS CORPORATION, Tokyo (JP)

(72) Inventors: Satoru Mori, Naka (JP); U Tani, Osaka (JP); Yuuji Sato, Iwaki (JP); Fumitake Kikuchi, Naka (JP); Isao Arai, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 352 days.

(21) Appl. No.: 15/754,403

(22) PCT Filed: Aug. 3, 2016

(86) PCT No.: PCT/JP2016/072819
§ 371 (c)(1),
(2) Date: Feb. 22, 2018

(87) PCT Pub. No.: WO2017/033694
PCT Pub. Date: Mar. 2, 2017

(65) Prior Publication Data
US 2018/0237901 A1 Aug. 23, 2018

(30) Foreign Application Priority Data

Aug. 24, 2015 (JP) .................. 2015-164631
Oct. 8, 2015 (JP) .................. 2015-200108
Oct. 8, 2015 (JP) .................. 2015-200109
Oct. 8, 2015 (JP) .................. 2015-200110
Feb. 22, 2016 (JP) .................. 2016-031174
Feb. 22, 2016 (JP) .................. 2016-031334

(51) Int. Cl.
C23C 14/34 (2006.01)
C25C 1/12 (2006.01)
C25C 7/02 (2006.01)
C22F 1/08 (2006.01)
C22C 9/00 (2006.01)

(52) U.S. Cl.
CPC ............ *C23C 14/3414* (2013.01); *C22C 9/00* (2013.01); *C22F 1/08* (2013.01); *C25C 1/12* (2013.01); *C25C 7/02* (2013.01)

(58) Field of Classification Search
CPC ..... C22C 9/00; C22F 1/08; C25C 1/12; C25C 7/02; C23C 14/3414
See application file for complete search history.

(56) References Cited

U.S. PATENT DOCUMENTS

| 2004/0072009 | A1 | 4/2004 | Segal et al. |
| 2008/0223728 | A1 | 9/2008 | Shindo et al. |
| 2009/0272466 | A1 | 11/2009 | Shindo et al. |
| 2011/0123389 | A1 | 5/2011 | Shindo et al. |
| 2011/0139615 | A1 | 6/2011 | Tatsumi et al. |
| 2011/0163447 | A1 | 7/2011 | Fukushima et al. |
| 2012/0328468 | A1 | 12/2012 | Kumagai et al. |
| 2016/0172167 | A1 | 6/2016 | Sakurai et al. |

FOREIGN PATENT DOCUMENTS

| JP | 02-185990 A | 7/1990 |
| JP | 10-060632 A | 3/1998 |
| JP | H11-158614 A | 6/1999 |
| JP | 3102177 B2 | 10/2000 |
| JP | 4680325 B2 | 5/2011 |
| JP | 2011-162835 A | 8/2011 |
| JP | 2014-201814 A | 10/2014 |
| JP | 2015-034337 A | 2/2015 |
| WO | 2005/073434 A1 | 8/2005 |
| WO | 2006-134724 A1 | 12/2006 |
| WO | 2010/038641 A1 | 4/2010 |
| WO | 2010/038642 A1 | 4/2010 |
| WO | 2015/005348 A1 | 1/2015 |

OTHER PUBLICATIONS

Supplementary European Search Report dated Jun. 6, 2019, issued for the European patent application No. 16839041.7.
International Search Report dated Oct. 25, 2016, issued for PCT/JP2016/072819 and English translation thereof.

*Primary Examiner* — Jessee R Roe
(74) *Attorney, Agent, or Firm* — Locke Lord LLP; James E. Armstrong, IV; Nicholas J. DiCeglie, Jr.

(57) ABSTRACT

A high purity copper sputtering target material includes Cu at a purity of 99.99998 mass % or more excluding O, H, N and C, wherein an Al content is 0.005 mass ppm or less, a Si content is 0.05 mass ppm or less, an Fe content is 0.02 mass ppm or less, a S content is 0.03 mass ppm or less, Cl content is 0.1 mass ppm or less, n O content is 1 mass ppm or less, H content is 1 mass ppm or less, a N content is 1 mass ppm or less, and a C content is 1 mass ppm or less.

7 Claims, No Drawings

HIGH PURITY COPPER SPUTTERING TARGET MATERIAL

TECHNICAL FIELD

The present invention relates to a high purity copper sputtering target material used in forming a wiring film (high purity copper film) of a flat panel display, a touch panel, or the like of a semiconductor device, a liquid crystal, an organic EL panel, or the like, for example.

Priority is claimed on: Japanese Patent Application No. 2015-164631 filed on Aug. 24, 2015; Japanese Patent Application No. 2015-200108 filed on Oct. 8, 2015; Japanese Patent Application No. 2015-200109 filed on Oct. 8, 2015; Japanese Patent Application No. 2015-200110 filed on Oct. 8, 2015; Japanese Patent Application No. 2016-031174 filed on Feb. 22, 2016; and Japanese Patent Application No. 2016-031334 filed on Feb. 22, 2016, the contents of which are incorporated herein by reference.

BACKGROUND ART

Conventionally, Al is widely used as wiring films of flat panel display, a touch panel, or the like of a semiconductor device, a liquid crystal, an organic EL panel, or the like. Recently, miniaturization (narrowing the width) and thinning of films of the wiring films are intended; and wirings having a specific resistance lower than that of the conventional wirings are required.

Accordingly, with the above-described miniaturization and thinning of the wiring films, a wiring film made of copper (Cu) that is a material having a lower specific resistance than that of Al is provided.

Normally, the above-described wiring films are deposited in a vacuum atmosphere by using a sputtering target. In the case of deposition using a sputtering target, it is possible for abnormal discharge (arching) due to the presence of foreign materials in the sputtering target to occur. In this case, a uniform wiring film cannot be formed. The abnormal discharge is a phenomenon in which extremely high current relative to the current in normal spurring flows suddenly and abnormally large discharge occurs suddenly. In the case of occurrence of such an abnormal discharge, it is possible to be a cause of particle formation. In addition, it is possible for the film thickness of the wiring film to be uneven. Therefore, it is required that occurrence of the abnormal discharge in deposition is circumvented.

Thus, techniques for suppressing the occurrence of the abnormal discharge in deposition on sputtering targets made of pure copper are proposed in Patent Literatures (PTLs) 1-5 indicated below.

A sputtering target made of high purity copper with a purity of 6N or more is proposed in PTL 1. In this high purity copper sputtering target described in PTL 1, each of contents of P, S, O and C is set to 1 ppm or less; and the number of non-metallic inclusion bodies having a particle size of 0.5 μm or more and 20 μm or less is set to 30,000/g or less. Thus, foreign materials in the sputtering target are reduced; and suppression of the occurrence of abnormal discharge (arching) and formation of particles is intended.

A high purity copper sputtering target, in which the purity of Cu excluding O, H, N and C is set in the range of 99.999980 mass % or more and 99.999998 mass % or less; and the Al content is 0.005 mass ppm or less and the Si content is 0.05 mass ppm or less, is proposed in PTL 2.

A pure copper plate (sputtering target), in which the ratio of the total length of the special grain boundaries $L\sigma$ with respect to the total length of grain boundaries L is set to 25% or more by performing working on a pure copper ingot having a purity of 99.96 mass % or more in a predetermined condition, in PTL 3. In addition, Vicker hardness is set to 40-90 Hv and the average crystal grain size is set to 10-120 μm.

A sputtering target made of pure copper having a purity of 99.99 mass % or more is proposed in PTL 4. The average crystal grain size is set to 40 μm or less. In addition, the ratio of the ($\Sigma3+\Sigma9$) grain boundary length ($L(\sigma3+\sigma9)/L$) is set to 28% or more. L is the total crystal grain length. $L((\sigma3+\sigma9)$ is the sum of: $L\sigma3$, which is the length of $\Sigma3$ crystal boundaries; and $L\sigma9$, which is the length of $\Sigma9$ crystal boundaries. L, $L\sigma3$, and $L\sigma9$ are measured by EBSD method A sputtering target made of pure copper having a purity of 99.995 mass % or more is proposed in PTL 5. It has a substantially recrystallized structure. The average crystal grain size is 80 μm or less. Vickers hardness is 100 Hv or less.

CITATION LIST

Patent Literature

PTL 1: Japanese Patent (Granted) Publication No. 4680325
PTL 2: Japanese Unexamined Patent Application, First Publication No. 2015-034337 (A)
PTL 3: Japanese Unexamined Patent Application, First Publication No. 2011-162835 (A)
PTL 4: Japanese Unexamined Patent Application, First Publication No. 2014-201814 (A)
PTL 5: Japanese Unexamined Patent Application, First Publication No. H11-158614 (A)

SUMMARY OF INVENTION

Technical Problem

Recently, even higher densification of wiring films is demanded in flat panel display, a touch panel, or the like of a semiconductor device, a liquid crystal, an organic EL panel, or the like. Thus, there is a need for forming the miniaturized and thinned wiring film stably than ever before. In addition, there is a need for applying a high voltage for faster film deposition. Even in the above-described case, suppressing the occurrence of the abnormal discharge is required.

In the above-described invention in PTLs 1-5, abnormal discharge (arching) in deposition cannot be suppressed sufficiently; and the miniaturized and thinned wiring films cannot be formed efficiently and stably.

The present invention is made under the circumstances described above. The purpose of the present invention is to provide a high purity copper sputtering target material capable of: suppressing the occurrence of the abnormal discharge even in the case where a high voltage is applied; and performing deposition stably.

Solution to Problem

In order to solve the technical problem described above, the present invention has aspects indicated below.

An aspect of the present invention is a high purity copper sputtering target material including Cu at a purity of 99.99998 mass % or more excluding O, H, N and C, wherein an Al content is 0.005 mass ppm or less, a Si content is 0.05 mass ppm or less, an Fe content is 0.02 mass ppm or less, a S content is 0.03 mass ppm or less, a Cl content is 0.1 mass ppm or less, an O content is 1 mass ppm or less, a H content is 1 mass ppm or less, a N content is 1 mass ppm or less, and a C content is 1 mass ppm or less.

In accordance to the high purity copper sputtering target in the above-described configuration, occurrence of foreign materials made of oxides, carbides, nitrides, sulfide, chloride, or the like in the sputtering target can be suppressed; and the occurrence of the abnormal discharge due to the foreign materials can be suppressed, since it has Cu at a purity of 99.99998 mass % or more excluding O, H, N and C, wherein an Al content is 0.005 mass ppm or less, a Si content is 0.05 mass ppm or less, an Fe content is 0.02 mass ppm or less, a S content is 0.03 mass ppm or less, a Cl content is 0.1 mass ppm or less, an O content is 1 mass ppm or less, a H content is 1 mass ppm or less, a N content is 1 mass ppm or less, and a C content is 1 mass ppm or less. Moreover, the degree of vacuum can be retained by suppressing formation of gases during deposition. Thus, film deposition can be performed stably.

In the above-described high purity copper sputtering target, which is an aspect of the present invention, a value of L15°/L may be 0.8 or more, L being a total length of grain boundaries formed between adjacent crystal grains with a crystal orientation difference in a range of more than 2° and 180° or less, and L15° being a length of large tilt angle grain boundaries formed between adjacent crystal grains with a crystal orientation difference in a range of 15° or more and 180° or less.

In this case, the ratio of a small tilt angle grain boundary, in which strain is relatively high, is reduced to a lower value for the generation status of secondary electrons in sputtering to be stabilized, since a value of L15°/L is 0.8 or more, L being a total length of grain boundaries formed between adjacent crystal grains with a crystal orientation difference in a range of more than 2° and 180° or less, and L15° being a length of large tilt angle grain boundaries formed between adjacent crystal grains with a crystal orientation difference in a range of 15° or more and 180° or less. Accordingly, the occurrence of the abnormal discharge can be suppressed.

In the above-described high purity copper sputtering target, which is an aspect of the present invention, a local orientation difference of crystal orientations obtained by a crystal orientation measurement by an electron backscattering diffraction may be 1.5° or less.

In this case, a local orientation difference in the crystal grain is reduced to a lower value for the generation status of secondary electrons in sputtering to be stabilized, since a local orientation difference of crystal orientations (KAM) obtained by measurement by EBSD is 1.5° or less. Accordingly, the occurrence of the abnormal discharge can be suppressed.

In the above-described high purity copper sputtering target, which is an aspect of the present invention, a total number of molecules of a released gas may be $5 \times 10^{17}$/g or less, the total number of molecules of a released gas being obtained by: heating a sample collected from the target material in an ultra-high vacuum of $1 \times 10^{-7}$ Pa or less with a temperature desorption gas analyzer (TDS-MS); ionizing gas components released between 50° C. and 1000° C. by an electron impact method; and performing a composition analysis on ions formed by the ionizing with a quadrupole mass spectrometer.

In this case, the amount of gases released into the Ar gas atmosphere from the target in sputtering is reduced to a lower value for the generation status of secondary electrons in sputtering to be stabilized, since a total number of molecules of a released gas between 50° C. and 1000° C. after heating a sample collected from the target material in an ultra-high vacuum of $1 \times 10^{-7}$ Pa or less in TDS-MS, is $5 \times 10^{17}$/g or less. Accordingly, the occurrence of the abnormal discharge can be suppressed. Examples of the above-described released gases include: $H_2$, $O_2$, $H_2O$, $CO$, $CO_2$ and the like.

In the above-described high purity copper sputtering target, which is an aspect of the present invention, an average value of local orientation differences between one measurement point and all of other measurement points in an identical crystal grain may be 4° or less, the average value being obtained by a crystal orientation measurement with an electron backscattering diffraction.

In this case, the local orientation difference in the crystal grain is reduced to a lower value for the generation status of secondary electrons in sputtering to be stabilized, since an average value of local orientation differences (GOS) between one measurement point and all of other measurement points in an identical crystal grain obtained by EBSD measurement is 4° or less. Accordingly, the occurrence of the abnormal discharge can be suppressed.

In the above-described high purity copper sputtering target, which is an aspect of the present invention, an area ratio of crystals having a plane orientation of <113>±10 on a sputter surface of the target may be 0.2 or less, the area ratio being obtained by a crystal orientation measurement with an electron backscattering diffraction.

In this case, the generation status of secondary electrons in sputtering is stabilized, since an area ratio of crystals having a plane orientation of <113>±10° on a sputter surface of the target obtained by EBSD measurement, is 0.2 or less, Accordingly, the occurrence of the abnormal discharge can be suppressed.

In the above-described high purity copper sputtering target, which is an aspect of the present invention, a number of molecules of a released $H_2O$ gas may be $2 \times 10^{17}$/g or less, the number of molecules of the released $H_2O$ gas being obtained by: heating a sample collected from the target material in an ultra-high vacuum of $1 \times 10^{-7}$ Pa or less with a temperature desorption gas analyzer (TDS-MS); ionizing gas components released between 50° C. and 1000° C. by an electron impact method; and performing a composition analysis on ions formed by the ionizing with a quadrupole mass spectrometer.

In this case, the amount of $H_2O$ gases released into the Ar gas atmosphere from the target in sputtering is reduced to a lower value for the generation status of secondary electrons in sputtering to be stabilized, since a total number of molecules of a released $H_2O$ gas between 50° C. and 1000° C. after heating a sample collected from the target material in an ultra-high vacuum of $1 \times 10^{-7}$ Pa or less in TDS-MS, is $2 \times 10^{17}$/g or less. Accordingly, the occurrence of the abnormal discharge can be suppressed.

In the above-described high purity copper sputtering target, which is an aspect of the present invention, it is preferable that an average crystal grain size is 70 µm or less.

The sputtering rate differs depending on the crystal orientations. Thus, protrusions and recesses due to the above-described sputtering rate difference are formed on the sputter surface as sputtering proceeds. The bigger the size of the crystal grain on the sputter surface, the larger the protrusions and recesses, for the abnormal discharge to occur by electrical charge being concentrated on the protrusions. Thus, by limiting the average crystal grain size on the sputter surface to 70 μm or less, the occurrence of the abnormal discharge can be suppressed further.

In addition, in the above-described high purity copper sputtering target, which is an aspect of the present invention, it is preferable that a Vickers hardness is set in a range of 35 Hv or more and 55 Hv or less.

In this case, since the Vickers hardness on the sputter surface is set to 55 Hv or less, the internal strain in the crystal grain is reduced to a lower value. Thus, secondary electrons are released uniformly during sputtering making it possible to perform film deposition stably. In addition, by reducing the internal strain, the sputtering rate becomes uniform. Accordingly, formation of the protrusions and recesses on the sputter surface can be suppressed as sputtering proceeds for the occurrence of the abnormal discharge to be suppressed.

On the other hand, since the Vickers hardness on the sputter surface is set to 35 Hv or more, the crystal grain size can be set at relatively small size. Accordingly, formation of the protrusions and recesses on the sputter surface can be suppressed as sputtering proceeds for the occurrence of the abnormal discharge to be suppressed.

Advantageous Effects of Invention

According to the present invention, a high purity copper sputtering target material capable of: suppressing the occurrence of the abnormal discharge even in the case where a high voltage is applied; and performing deposition stably, can be provided.

DESCRIPTION OF EMBODIMENTS

First Embodiment

The high purity copper sputtering target material related to the first embodiment of the present invention is explained below.

The high purity copper sputtering target material of the present embodiment is used in deposition of a high purity copper film used as wiring film of flat panel display, a touch panel, or the like of a semiconductor device, a liquid crystal, an organic EL panel, or the like on a substrate.

The composition of the high purity copper sputtering target material of the present embodiment includes Cu at a purity of 99.99998 mass % or more excluding O, H, N and C, wherein an Al content is 0.005 mass ppm or less, a Si content is 0.05 mass ppm or less, an Fe content is 0.02 mass ppm or less, a S content is 0.03 mass ppm or less, a Cl content is 0.1 mass ppm or less, an O content is 1 mass ppm or less, a H content is 1 mass ppm or less, a N content is 1 mass ppm or less, and a C content is 1 mass ppm or less.

In addition, in the high purity copper sputtering target material of the present embodiment, a value of L15°/L is 0.8 or more, L being a total length of grain boundaries formed between adjacent crystal grains with a crystal orientation difference in a range of more than 2° and 180° or less, and L15° being a length of large tilt angle grain boundaries formed between adjacent crystal grains with a crystal orientation difference in a range of 15° or more and 180° or less.

In addition, in the high purity copper sputtering target material of the present embodiment, an average crystal grain size is 70 μm or less; and a Vickers hardness is set in a range of 35 Hv or more and 55 Hv or less.

Reasons for the above-described settings of the composition, crystal grain boundaries, the average crystal grain size, and the Vickers hardness of the high purity copper sputtering target material of the present embodiment are explained below.

(Cu: 99.99998 Mass % or More)

In the case of depositing a wiring film (high purity copper film) by sputtering, it is preferable that the content of impurities is reduced as low as possible in order to suppress the abnormal discharge (arching). If the purity of Cu is 99.99998 mass % or more, significant increase of the production cost can be suppressed without necessity to perform a purification process more than needed.

(Al: 0.005 Mass ppm or Less)

Al is an element that forms oxide, carbide, nitride, and the like easily. Thus, it has a tendency to be resided as foreign materials in the sputtering target. Therefore, by limiting the Al content to 0.005 mass ppm or less, the occurrence of the abnormal discharge (arching) in deposition can be suppressed even if the purity of Cu is 99.99998 mass % or more.

(Si: 0.05 Mass ppm or Less)

Si is an element that forms oxide, carbide, nitride, and the like easily. Thus, it has a tendency to be resided as foreign materials in the sputtering target. Therefore, by limiting the Si content to 0.05 mass ppm or less, the occurrence of the abnormal discharge (arching) in deposition can be suppressed even if the purity of Cu is 99.99998 mass % or more.

(Fe: 0.02 Mass ppm or Less)

Fe is an element that forms oxide, carbide, nitride, and the like easily with respect to copper. Thus, it has a tendency to be resided as foreign materials in the high purity copper sputtering target. Therefore, by limiting the Fe content to 0.02 mass ppm or less, the occurrence of the abnormal discharge (arching) in deposition can be suppressed even if the purity of Cu is 99.99998 mass % or more.

(S: 0.03 Mass ppm or Less)

S is an element that forms sulfide by reacting to other impurity elements to be resided as foreign materials in the sputtering target easily. In addition, in the case where S exists as a single element, it is converted to gas or ionized in deposition to deteriorate the degree of vacuum, possibly inducing the abnormal discharge (arching). Because of these, the S content is set to 0.03 mass ppm or less in the present embodiment.

(Cl: 0.1 Mass ppm or Less)

Cl is an element that forms chloride by reacting to other impurity elements to be resided as foreign materials in the sputtering target easily. In addition, in the case where Cl exists as a single element, it is converted to gas or ionized in deposition to deteriorate the degree of vacuum, possibly inducing the abnormal discharge (arching). Because of these, the Cl content is set to 0.1 mass ppm or less in the present embodiment.

(O, H, N: 1 Mass ppm or Less for Each of them)

Deposition of a film by a sputtering target is performed in vacuum atmosphere. If the above-mentioned gases exist in a large quantity, they deteriorate the degree of vacuum in deposition, possibly inducing the abnormal discharge (arching). In addition, there is a possibility that particles are formed by the abnormal discharge and the quality of the high purity copper film is deteriorated. Because of these, each content of O, H, and N is set to 1 mass ppm or less in the present embodiment.

(C: 1 mass ppm or less)

C is an element that forms carbide by reacting to other impurity elements to be resided as foreign materials in the sputtering target easily. In addition, C is resided as a single element easily in the sputtering target. Thus, it is possible that C introduces the abnormal discharge (arching). Because of these, the C content is set to 1 mass ppm or less in the present embodiment.

In the present embodiment, upper limits are set for each of impurity elements as described above. In addition to these setting, it is necessary to set the total amount of these impurity elements so that the purity of Cu excluding O, H, N, and C becomes 99.99998 mass % or more.

Analysis of impurity elements excluding O, H, N, and C can be performed by using a glow discharge mass spectrometer (GD-MS).

Analysis of O can be performed by the inert gas fusion-infrared adsorption method. Analysis of H and N and be performed by the inert gas fusion-heat conduction method. Analysis of C can be performed by the combustion-infrared adsorption method.

(Ratio of the Length of a Large Tilt Angle Grain Boundaries L15° to the Total Length of Grain Boundaries L, L15°/L: 0.8 or More)

A small tilt angle grain boundary, in which crystal orientation difference between adjacent crystal grains is more than 2° and less than 15°, has a relatively high strain. Thus, when there are a larger amount of these small tilt angle grain boundaries, there is a possibility that the generation status of secondary electrons in sputtering is destabilized in the region where the strain exists.

Thus, in the present embodiment, a value of L15°/L is set to 0.8 or more, L being a total length of grain boundaries formed between adjacent crystal grains with a crystal orientation difference in a range of more than 2° and 180° or less, and L15° being a length of large tilt angle grain boundaries formed between adjacent crystal grains with a crystal orientation difference in a range of 15° or more and 180° or less. By satisfying this configuration, the abundance ratio of the above-described small tilt angle grain boundaries is reduced; and the generation status of secondary electrons in sputtering can be stabilized.

In order to stabilize the generation status of secondary electrons in sputtering, it is preferable that the above-described ratio L15°/L is set to 0.85 or more. More preferably, it is set to 0.9 or more.

(Average Crystal Grain Size: 70 μm or Less)

The sputtering rate differs depending on crystal orientations. Thus, due to the above-described sputtering rate differences, protrusions and recesses corresponding to crystal grains are formed on the sputter surface as sputter proceeds.

If the average crystal grain size exceeds 70 μm, the sizes of the protrusions and recesses formed on the sputter surface are increased for the electrical charge to be concentrated on the protrusions, making it easier for the abnormal discharge to occur.

Because of the reason, the average crystal grain size is set to 70 μm or less in the high purity copper sputtering target in the present embodiment.

In order to reliably suppress the abnormal discharge by suppressing formation of the protrusions and recesses on the sputter surface as sputter proceeds, it is preferable that the average crystal grain size is set to 60 μm or less. More preferably, it is set to 50 μm or less.

(Vickers Hardness: 35 Hv or More and 55 Hv or Less)

In the high purity copper sputtering target material of the present embodiment, if the Vickers hardness exceeds 55 Hv, the internal strain in the crystal grain is increased to a higher value. In that case, there is a possibility that the generation status of secondary electrons in sputtering is destabilized; and deposition cannot be performed stably. In addition, there is a possibility that the sputtering rate becomes uneven due to the presence of the internal strain; the protrusions and recesses are formed; and the number of the micro-arc discharge increases. On the other hand, if the Vickers hardness is less than 35 Hv, the crystal grain size is coarsened. Thus, the protrusions and recessed are formed on the sputter surface as sputtering proceeds, making it easier for the abnormal discharge to occur.

Because of these reasons, the Vickers hardness is set in a range of 35 Hv or more and 55 Hv or less in the present embodiment.

In order to reliably suppress the abnormal discharge by suppressing coarsening of the crystal grain size, it is preferable that the lower limit of the Vickers hardness is set to 37 Hv or more. More preferably, it is set to 39 Hv or more.

In addition, in order to reliably suppress unevenness of the film thickness and micro-arc discharge by equalizing the sputtering rate, it is preferable that the upper limit of the Vickers hardness on the sputter surface is set to 53 Hv or less. More preferably, it is set to 50 Hv or less.

Next, a method of producing a high purity copper sputtering target material, which is the present embodiment, is explained.

First, electrolytic copper having copper purity of 99.99 mass % or more is prepared and electrically purified further.

Then, electrolysis is performed with the above-described electrolytic copper as an anode and a titanium plate as a cathode after immersing these anode and cathode in electrolyte. The electrolyte is prepared by diluting a reagent grade copper nitrate with water and adding hydrochloric acid further. By adding hydrochloric acid to the copper nitrate electrolyte as explained above, formation of nitrite gas can be suppressed; and the amount of impurities in electrodeposited copper can be reduced (refer Japanese Patent (Granted) Publication No. 3102177). By performing the above-described electrolytic refining, the high purity copper having a purity of 99.99998 mass % or more excluding O, H, N, and C can be obtained.

In the present embodiment, each of the contents of Al, Si, and Fe of the anode (electrolytic copper) used in the electrolytic refining process is set to 1 mass ppm or less; and each of the contents of Al, Si, and Fe in the electrolyte is set to 1 mass ppm or less.

In addition, the degree of cleanness in the room where the electrolytic refining is performed is set to a class of 10000 or less. By performing the electrolytic refining in the above-described conditions, the Al content, the Si content, and the Fe content of the high purity copper sputtering target material can be set to 0.005 mass ppm or less, 0.05 mass ppm or less, and 0.02 mass ppm or less, respectively.

In addition, a nitric acid based electrolyte is used for reducing the amount of S during electrolytic refining in the present embodiment. A glue, organic polymer, or the like is added to the electrolyte in order to smooth the cathode surface. However, a glue, organic polymer, or the like contains impurities such as S. Once the impurities are incorporated into the cathode, the S concentration in the cathode increases. Thus, a synthetic polymer such as a mixture of polyethylene glycol and polyvinyl alcohol, both of which have a low S content, is used as additives to the nitric acid based electrolyte in combination in the present embodiment.

Moreover, Cl, O, H, and N can be reduced to a predetermined concentration by dissolving them in a high vacuum of $10^{-4}$ Pa or less to be converted into gas form and volatilized in vacuum.

Solubility of C in Cu increases by raising the melting temperature. However, by retaining the melting temperature at a low temperature, the C content can be kept at a predetermined concentration or less even if the material is melted in a container made of high purity graphite. More specifically, by melting the material at 1150° C. or less, the predetermined C concentration can be retained.

As described above, the high purity copper, which has a purity of 99.99998 mass % or more excluding O, H, N and C, wherein an Al content is 0.005 mass ppm or less, a Si content is 0.05 mass ppm or less, an Fe content is 0.02 mass ppm or less, a S content is 0.03 mass ppm or less, a Cl content is 0.1 mass ppm or less, an O content is 1 mass ppm or less, a H content is 1 mass ppm or less, a N content is 1 mass ppm or less, and a C content is 1 mass ppm or less, can be obtained.

Next, by using the above-described high purity copper as the raw material and melting the high purity copper in a vacuum melting furnace, a high purity copper ingot is produced.

Hot working is performed on the obtained high purity copper ingot in the temperature range of 450-700° C. By the hot working, the casting structure is destroyed, and the structure is controlled to have equiaxed crystal grains.

Next, cold working is performed on the hot forged material. In order to increase the ratios of: the fine and uniform crystal grains; and the large tilt angle grain boundaries, it is effective to set a large rolling reduction rate in the cold working. By performing the cold work as explained above, recrystallization occurs easily in the subsequent heat treatment after the cold working; and the ratio of the large tilt angle crystal grain boundaries is increased. Because of this, it is preferable that the rolling reduction rate is set to 15% or more and 25% or less per single rolling pass. Moreover, it is preferable that the rolling rate over the entire rolling is set to 40% or more.

Next, the recrystallization treatment is performed to the cold worked material. It is preferable that the temperature of the heat treatment is set to 350° C. or more and 450° C. or less; and the retention time is set in the range of 1 hour or more and 2 hours or less.

The value of L15°/L may be adjusted to 0.8 or more by repeating the cold working and the heat treatment multiple times.

As explained above, the high purity copper sputtering target material of the present embodiment is produced.

According to the high purity copper sputtering target material of the present embodiment as configured above, there is no need to perform the purification process more than needed; and the high purity copper sputtering target material can be produced at a relatively low cost, since the purity of Cu excluding O, H, N, and C is set to 99.99998 mass % or more.

In addition, formation of foreign materials in the sputtering target can be suppressed; and occurrence of the abnormal discharge due to the foreign materials can be suppressed, since an Al content is set to 0.005 mass ppm or less, a Si content is set to 0.05 mass ppm or less, an Fe content is set to 0.02 mass ppm or less, a S content is set to 0.03 mass ppm or less, a Cl content is set to 0.1 mass ppm or less, an O content is set to 1 mass ppm or less, a H content is set to 1 mass ppm or less, a N content is set to 1 mass ppm or less, and a C content is set to 1 mass ppm or less.

Moreover, since the contents of S, Cl, O, H, and N, which are the cause of gas formation in deposition, are set as described above, the degree of vacuum can be retained; and deposition can be performed stably.

In addition, in the high purity copper sputtering target material of the present embodiment, the ratio of a small tilt angle grain boundary, in which strain is relatively high, is reduced to a lower value for the generation status of secondary electrons in sputtering to be stabilized, since a value of L15°/L is 0.8 or more, L being a total length of grain boundaries formed between adjacent crystal grains with a crystal orientation difference in a range of more than 2° and 180° or less, and L15° being a length of large tilt angle grain boundaries formed between adjacent crystal grains with a crystal orientation difference in a range of 15° or more and 180° or less. Accordingly, the occurrence of the abnormal discharge can be suppressed.

In addition, in the high purity copper sputtering target material, the average crystal grain size is set to 70 μm or less. Thus, in the case where protrusions and recesses corresponding to crystal grains are formed on the sputter surface as sputtering proceeds, the sizes of the protrusions and recesses do not increase. Accordingly, the occurrence of the abnormal discharge can be suppressed further.

In addition, in the high purity copper sputtering target material, the Vickers hardness is set to 35 Hv or more. Thus, the crystal grain size can be retained in a relatively small size. Accordingly, the occurrence of the abnormal discharge can be suppressed even in the case where protrusions and recesses corresponding to crystal grains are formed on the sputter surface as sputtering proceeds.

In addition, since the Vickers hardness is set to 55 Hv or less, the internal strain in the crystal grain is reduced; and release of the secondary electrons in sputtering becomes uniform. Accordingly, sputtering deposition can be performed stably. Moreover, the sputtering rate being uneven due to the internal strain can be suppressed; formation of the protrusions and recesses on the sputter surface as sputtering proceeds can be suppressed; and the occurrence of the abnormal discharge can be suppressed.

Second Embodiment

The high purity copper sputtering target material related to the second embodiment of the present invention is explained below.

The use of the high purity copper sputtering target material of the present embodiment is the same as the first embodiment. Thus, descriptions thereof is omitted.

The composition of the high purity copper sputtering target material of the present embodiment is the same as the first embodiment. Thus, detailed explanations are omitted.

In the high purity copper sputtering target material of the present embodiment, the local orientation difference of crystal orientations (KAM) obtained by EBSD measurement is set to 1.5° or less.

In addition, in the high purity copper sputtering target material of the present embodiment, an average crystal grain size is 70 μm or less; and a Vickers hardness is set in a range of 35 Hv or more and 55 Hv or less.

Reasons for the above-described settings of the local orientation difference (KAM), the average crystal grain size, and the Vickers hardness of the high purity copper sputtering target material of the present embodiment are explained below. The reason for the setting of the composition of the high purity copper sputtering target material of the present embodiment is the same as the first embodiment. Thus, detailed explanations are omitted.

(KAM Value is 1.5° or Less)

If the local orientation difference (Kernel Average Misorientation: KAM) exceeds 1.5°, strain in the crystal grain is relatively high. Thus, it is possible that the generation status of the secondary electrons in sputtering is destabilized in the region where this strain exists.

Therefore, the strain in the crystal grain is reduced by setting the KAM to 1.5° or less in the present embodiment. Accordingly, the generation status of the secondary electrons in sputtering can be stabilized.

In order to reliably stabilize the generation status of secondary electrons in sputtering, it is preferable that the above-described KAM is set to 1.0° or less. More preferably, it is set to 0.7° or less.

(Average Crystal Grain Size: 70 μm or Less)

The sputtering rate differs depending on crystal orientations. Thus, due to the above-described sputtering rate differences, protrusions and recesses corresponding to crystal grains are formed on the sputter surface as sputter proceeds.

If the average crystal grain size exceeds 70 μm, the sizes of the protrusions and recesses formed on the sputter surface are increased for the electrical charge to be concentrated on the protrusions, making it easier for the abnormal discharge to occur.

Because of the reason, the average crystal grain size is set to 70 μm or less in the high purity copper sputtering target in the present embodiment.

In order to reliably suppress the abnormal discharge by suppressing formation of the protrusions and recesses on the sputter surface as sputter proceeds, it is preferable that the average crystal grain size is set to 60 μm or less. More preferably, it is set to 50 μm or less.

(Vickers Hardness: 35 Hv or More and 55 Hv or Less)

In the high purity copper sputtering target material of the present embodiment, if the Vickers hardness exceeds 55 Hv, the internal strain in the crystal grain is increased to a higher value. In that case, there is a possibility that the generation status of secondary electrons in sputtering is destabilized; and deposition cannot be performed stably. In addition, there is a possibility that the sputtering rate becomes uneven due to the presence of the internal strain; the protrusions and recesses are formed; and the number of the micro-arc discharge increases. On the other hand, if the Vickers hardness is less than 35 Hv, the crystal grain size is coarsened. Thus, the protrusions and recessed are formed on the sputter surface as sputtering proceeds, making it easier for the abnormal discharge to occur.

Because of these reasons, the Vickers hardness is set in a range of 35 Hv or more and 55 Hv or less in the present embodiment.

In order to reliably suppress the abnormal discharge by suppressing coarsening of the crystal grain size, it is preferable that the lower limit of the Vickers hardness is set to 37 Hv or more. More preferably, it is set to 39 Hv or more. In addition, in order to reliably suppress unevenness of the film thickness and micro-arc discharge by equalizing the sputtering rate, it is preferable that the upper limit of the Vickers hardness on the sputter surface is set to 53 Hv or less. More preferably, it is set to 50 Hv or less.

Next, a method of producing a high purity copper sputtering target material, which is the present embodiment, is explained. The method of producing the high purity copper sputtering target material of the present embodiment is the same as the first embodiment. Thus, explanation of the method of producing the high purity copper sputtering target material is omitted in the present embodiment.

Hot working is performed on the obtained high purity copper ingot in the temperature range of 450-700° C. By the hot working, the casting structure is destroyed, and the structure is controlled to have equiaxed crystal grains. After that, in order to reduce the local orientation difference of crystal orientations (KAM), a heat treatment is performed in the temperature range of 500-700° C. for the retention time of 1-2 hours.

Next, cold working is performed on the above-described heat treated material. In order to obtain the fine and uniform crystal grains and to reduce the local orientation difference of crystal orientations for the strain in the crystal grain to be reduced, it is effective to set a large rolling reduction rate in the cold working. By performing the cold work as explained above, recrystallization occurs easily in the subsequent heat treatment after the cold working; and the local orientation difference of crystal orientations becomes a lower value, and the strain in the crystal grain is reduced. Because of this, it is preferable that the rolling reduction rate is set to 15% or more and 25% or less per single rolling pass. Moreover, it is preferable that the rolling rate over the entire rolling is set to 40% or more.

Next, the recrystallization treatment is performed to the cold worked material. It is preferable that the temperature of the heat treatment is set to 350° C. or more and 450° C. or less; and the retention time is set in the range of 1 hour or more and 2 hours or less.

The local orientation difference of crystal orientations (KAM) may be adjusted to 1.5° or less by repeating the cold working and the heat treatment multiple times.

As explained above, the high purity copper sputtering target material of the present embodiment is produced.

The composition of the high purity copper sputtering target material of the present embodiment as configured above is the same as the first embodiment. Thus, explanation is omitted.

In addition, in the high purity copper sputtering target material of the present embodiment, the local orientation difference of crystal orientations (KAM) is set to 1.5° or less. Thus, there is less strain in the crystal grain and the generation status of the secondary electrons in sputtering is stabilized. Accordingly, the occurrence of the abnormal discharge can be suppressed.

In addition, in the high purity copper sputtering target material, the average crystal grain size is set to 70 μm or less. Thus, in the case where protrusions and recesses corresponding to crystal grains are formed on the sputter surface as sputtering proceeds, the sizes of the protrusions and recesses do not increase. Accordingly, the occurrence of the abnormal discharge can be suppressed further.

In addition, in the high purity copper sputtering target material, the Vickers hardness is set to 35 Hv or more. Thus, the crystal grain size can be retained in a relatively small size. Accordingly, the occurrence of the abnormal discharge can be suppressed even in the case where protrusions and recesses corresponding to crystal grains are formed on the sputter surface as sputtering proceeds.

In addition, since the Vickers hardness is set to 55 Hv or less, the internal strain in the crystal grain is reduced; and release of the secondary electrons in sputtering becomes uniform. Accordingly, sputtering deposition can be performed stably. Moreover, the sputtering rate being uneven due to the internal strain can be suppressed; formation of the protrusions and recesses on the sputter surface as sputtering proceeds can be suppressed; and the occurrence of the abnormal discharge can be suppressed.

Third Embodiment

The high purity copper sputtering target material related to the third embodiment of the present invention is explained below.

The use of the high purity copper sputtering target material of the present embodiment is the same as the first embodiment. Thus, descriptions thereof is omitted.

The composition of the high purity copper sputtering target material of the present embodiment is the same as the first embodiment. Thus, detailed explanations are omitted.

In the high purity copper sputtering target material of the present embodiment, a total number of molecules of a released gas such as $H_2$, $O_2$, $H_2O$, CO, and $CO_2$ is $5 \times 10^{17}$/g or less, the total number of molecules of a released gas being obtained by: heating a sample collected from the target material in a predetermined size in an ultra-high vacuum of $1 \times 10^{-7}$ Pa or less with a temperature desorption gas analyzer (TDS-MS); ionizing gas components released between 50° C. and 1000° C. by an electron impact method; and performing a composition analysis on ions formed by the ionizing with a quadrupole mass spectrometer.

In addition, in the high purity copper sputtering target material of the present embodiment, an average crystal grain size is 70 μm or less; and a Vickers hardness is set in a range of 35 Hv or more and 55 Hv or less.

Reasons for the above-described settings of the number of molecules of the released gas, the average crystal grain size, and the Vickers hardness of the high purity copper sputtering target material of the present embodiment are explained below. The reason for the setting of the composition of the high purity copper sputtering target material of the present embodiment is the same as the first embodiment. Thus, detailed explanations are omitted.

(Total Number of Molecules of the Released Gas is $5 \times 10^{17}$/g or Less)

The more strains in the crystal grain, the more defects in the crystal grains. Through the defects, gases dissolved in copper diffuse to the surface of the target in melting the target. Such gases are released in sputtering and the generation status of the secondary electrons in sputtering is destabilized. Therefore, if the total number of molecules of a released gas such as $H_2$, $O_2$, $H_2O$, CO, and $CO_2$ exceeds $5 \times 10^{17}$/g, it is possible that the generation status of the secondary electrons in Ar sputtering is destabilized since there is a larger amount of gases released in the Ar atmosphere. The above-mentioned gases are gases released between 50° C. and 1000° C. in heating of a sample collected from the target material in a predetermined size in an ultra-high vacuum of $1 \times 10^{-7}$ Pa or less with TDS-MS.

Therefore, by setting the total number of molecules of the released gas such as $H_2$, $O_2$, $H_2O$, CO, and $CO_2$ from the sample in a predetermined size collected from the target material to $5 \times 10^{17}$/g or less, the amount of gases released to the Ar gas atmosphere is reduced. Accordingly, the generation status of the secondary electrons in sputtering can be stabilized.

In order to reliably stabilize the generation status of secondary electrons in sputtering, it is preferable that the above-described total number of the released gases such as $H_2$, $O_2$, $H_2O$, CO, and $CO_2$ is set to $4 \times 10^{17}$/g or less.

(Average Crystal Grain Size: 70 μm or Less)

The sputtering rate differs depending on crystal orientations. Thus, due to the above-described sputtering rate differences, protrusions and recesses corresponding to crystal grains are formed on the sputter surface as sputter proceeds.

If the average crystal grain size exceeds 70 μm, the sizes of the protrusions and recesses formed on the sputter surface are increased for the electrical charge to be concentrated on the protrusions, making it easier for the abnormal discharge to occur.

Because of the reason, the average crystal grain size is set to 70 μm or less in the high purity copper sputtering target in the present embodiment.

In order to reliably suppress the abnormal discharge by suppressing formation of the protrusions and recesses on the sputter surface as sputter proceeds, it is preferable that the average crystal grain size is set to 60 μm or less. More preferably, it is set to 50 μm or less.

(Vickers Hardness: 35 Hv or More and 55 Hv or Less)

In the high purity copper sputtering target material of the present embodiment, if the Vickers hardness exceeds 55 Hv, the internal strain in the crystal grain is increased to a higher value. In that case, there is a possibility that the generation status of secondary electrons in sputtering is destabilized; and deposition cannot be performed stably. In addition, there is a possibility that the sputtering rate becomes uneven due to the presence of the internal strain; the protrusions and recesses are formed; and the number of the micro-arc discharge increases. On the other hand, if the Vickers hardness is less than 35 Hv, the crystal grain size is coarsened. Thus, the protrusions and recessed are formed on the sputter surface as sputtering proceeds, making it easier for the abnormal discharge to occur.

Because of these reasons, the Vickers hardness is set in a range of 35 Hv or more and 55 Hv or less in the present embodiment.

In order to reliably suppress the abnormal discharge by suppressing coarsening of the crystal grain size, it is preferable that the lower limit of the Vickers hardness is set to 37 Hv or more. More preferably, it is set to 39 Hv or more. In addition, in order to reliably suppress unevenness of the film thickness and micro-arc discharge by equalizing the sputtering rate, it is preferable that the upper limit of the Vickers hardness on the sputter surface is set to 53 Hv or less. More preferably, it is set to 50 Hv or less.

Next, a method of producing a high purity copper sputtering target material, which is the present embodiment, is explained. The method of producing the high purity copper sputtering target material of the present embodiment is the same as the first embodiment. Thus, explanation of the method of producing the high purity copper sputtering target material is omitted in the present embodiment.

Hot working is performed on the obtained high purity copper ingot in the temperature range of 450-700° C. By the hot working, the casting structure is destroyed, and the structure is controlled to have equiaxed crystal grains. After that, hot rolling is performed in the temperature range of 450-700° C. to be in a predetermine shape.

Next, cold working is performed on the above-described hot rolled material. In order to obtain the fine and uniform crystal grains and to reduce strains and defects in the crystal grain, it is effective to set a large rolling reduction rate in the cold working. By performing the cold work as explained above, recrystallization occurs easily in the subsequent heat treatment after the cold working; and the strains and defects in the crystal grains are reduced and the amount of the released gas decreases. Because of this, it is preferable that the rolling reduction rate is set to 15% or more and 25% or less per single rolling pass. Moreover, it is preferable that the rolling rate over the entire rolling is set to 40% or more.

Next, the recrystallization treatment is performed to the cold worked material. It is preferable that the temperature of the heat treatment is set to 350° C. or more and 450° C. or less; and the retention time is set in the range of 1 hour or more and 2 hours or less.

The total number of molecules of the released gas such as $H_2$, $O_2$, $H_2O$, CO, and $CO_2$ from the sample in a predetermined size collected from the target material may be adjusted to $5\times10^{17}$/g or less by repeating the cold working and the heat treatment multiple times.

As explained above, the high purity copper sputtering target material of the present embodiment is produced.

The composition of the high purity copper sputtering target material of the present embodiment as configured above is the same as the first embodiment. Thus, explanation is omitted.

In addition, in the high purity copper sputtering target material of the present embodiment, the total number of molecules of the released gas such as $H_2$, $O_2$, $H_2O$, CO, and $CO_2$ from the sample in a predetermined size collected from the target material in ultra-vacuum of $1\times10^{-7}$ Pa is set to $5\times10^{17}$/g or less. Thus, there is less amount of the released gases in sputtering and the generation status of the secondary electrons in sputtering is stabilized. Accordingly, the occurrence of the abnormal discharge can be suppressed.

In addition, in the high purity copper sputtering target material, the average crystal grain size is set to 70 μm or less. Thus, in the case where protrusions and recesses corresponding to crystal grains are formed on the sputter surface as sputtering proceeds, the sizes of the protrusions and recesses do not increase. Accordingly, the occurrence of the abnormal discharge can be suppressed further.

In addition, in the high purity copper sputtering target material, the Vickers hardness is set to 35 Hv or more. Thus, the crystal grain size can be retained in a relatively small size. Accordingly, the occurrence of the abnormal discharge can be suppressed even in the case where protrusions and recesses corresponding to crystal grains are formed on the sputter surface as sputtering proceeds.

In addition, since the Vickers hardness is set to 55 Hv or less, the internal strain in the crystal grain is reduced; and release of the secondary electrons in sputtering becomes uniform. Accordingly, sputtering deposition can be performed stably. Moreover, the sputtering rate being uneven due to the internal strain can be suppressed; formation of the protrusions and recesses on the sputter surface as sputtering proceeds can be suppressed; and the occurrence of the abnormal discharge can be suppressed.

Fourth Embodiment

The high purity copper sputtering target material related to the fourth embodiment of the present invention is explained below.

The use of the high purity copper sputtering target material of the present embodiment is the same as the first embodiment. Thus, descriptions thereof is omitted.

The composition of the high purity copper sputtering target material of the present embodiment is the same as the first embodiment. Thus, detailed explanations are omitted.

In the high purity copper sputtering target material of the present embodiment, an average value of local orientation differences between one measurement point and all of other measurement points in an identical crystal grain (GOS) is 4° or less, the average value being obtained by EBSD measurement.

In addition, in the high purity copper sputtering target material of the present embodiment, an average crystal grain size is 70 μm or less; and a Vickers hardness is set in a range of 35 Hv or more and 55 Hv or less.

Reasons for the above-described settings of GOS, the average crystal grain size, and the Vickers hardness of the high purity copper sputtering target material of the present embodiment are explained below. The reason for the setting of the composition of the high purity copper sputtering target material of the present embodiment is the same as the first embodiment. Thus, detailed explanations are omitted.

(GOS Value is 4° or Less)

If the average value of local orientation differences between one measurement point and all of other measurement points in an identical crystal grain (GOS) exceeds 4°, since there is relatively large strain, it is possible that the generation status of the secondary electrons in sputtering is destabilized in the region where the strain exists.

Therefore, the strain in the crystal grain is reduced by setting the above-described GOS to 4° or less, in the present embodiment. Accordingly, the generation status of the secondary electrons in sputtering can be stabilized.

In order to reliably stabilize the generation status of secondary electrons in sputtering, it is preferable that the above-described GOS is set to 3° or less.

(Average Crystal Grain Size: 70 μm or Less)

The sputtering rate differs depending on crystal orientations. Thus, due to the above-described sputtering rate differences, protrusions and recesses corresponding to crystal grains are formed on the sputter surface as sputter proceeds.

If the average crystal grain size exceeds 70 μm, the sizes of the protrusions and recesses formed on the sputter surface are increased for the electrical charge to be concentrated on the protrusions, making it easier for the abnormal discharge to occur.

Because of the reason, the average crystal grain size is set to 70 μm or less in the high purity copper sputtering target in the present embodiment.

In order to reliably suppress the abnormal discharge by suppressing formation of the protrusions and recesses on the sputter surface as sputter proceeds, it is preferable that the average crystal grain size is set to 60 μm or less. More preferably, it is set to 50 μm or less.

(Vickers Hardness: 35 Hv or More and 55 Hv or Less)

In the high purity copper sputtering target material of the present embodiment, if the Vickers hardness exceeds 55 Hv, the internal strain in the crystal grain is increased to a higher value. In that case, there is a possibility that the generation status of secondary electrons in sputtering is destabilized; and deposition cannot be performed stably. In addition, there is a possibility that the sputtering rate becomes uneven due to the presence of the internal strain; the protrusions and recesses are formed; and the number of the micro-arc discharge increases. On the other hand, if the Vickers hardness is less than 35 Hv, the crystal grain size is coarsened. Thus, the protrusions and recessed are formed on the sputter surface as sputtering proceeds, making it easier for the abnormal discharge to occur.

Because of these reasons, the Vickers hardness is set in a range of 35 Hv or more and 55 Hv or less in the present embodiment.

In order to reliably suppress the abnormal discharge by suppressing coarsening of the crystal grain size, it is preferable that the lower limit of the Vickers hardness is set to 37 Hv or more. More preferably, it is set to 39 Hv or more. In addition, in order to reliably suppress unevenness of the film thickness and micro-arc discharge by equalizing the sputtering rate, it is preferable that the upper limit of the Vickers hardness on the sputter surface is set to 53 Hv or less. More preferably, it is set to 50 Hv or less.

Next, a method of producing a high purity copper sputtering target material, which is the present embodiment, is explained. The method of producing the high purity copper sputtering target material of the present embodiment is the same as the first embodiment. Thus, explanation of the method of producing the high purity copper sputtering target material is omitted in the present embodiment.

Hot working is performed on the obtained high purity copper ingot in the temperature range of 450-700° C. By the hot working, the casting structure is destroyed, and the structure is controlled to have equiaxed crystal grains.

Next, in order to reduce the local orientation difference of the crystal orientation in the identical crystal grain, cold working is performed on the above-described hot forged material after performing a heat treatment in the temperature range of 700-900° C. for a retention time of 1 to 2 hours. In order to obtain the fine and uniform crystal grains and to reduce strains in the crystal grain, it is effective to set a large rolling reduction rate in the cold working. By performing the cold work as explained above, recrystallization occurs easily in the subsequent heat treatment after the cold working; and the strain in the crystal grain is reduced. Because of this, it is preferable that the rolling reduction rate is set to 15% or more and 25% or less per single rolling pass. Moreover, it is preferable that the rolling rate over the entire rolling is set to 40% or more.

Next, the recrystallization treatment is performed to the cold worked material. It is preferable that the temperature of the heat treatment is set to 350° C. or more and 450° C. or less; and the retention time is set in the range of 1 hour or more and 2 hours or less.

The average value of local orientation differences between one measurement point and all of other measurement points in the identical crystal grain (GOS) may be adjusted to 4° or less by repeating the cold working and the heat treatment multiple times.

As explained above, the high purity copper sputtering target material of the present embodiment is produced.

The composition of the high purity copper sputtering target material of the present embodiment as configured above is the same as the first embodiment. Thus, explanation is omitted.

In addition, in the high purity copper sputtering target material of the present embodiment, the average value of local orientation differences between one measurement point and all of other measurement points in the identical crystal grain (GOS) is adjusted to 4° or less. Thus, there is less strain in the crystal grain and the generation status of the secondary electrons in sputtering is stabilized. Accordingly, the occurrence of the abnormal discharge can be suppressed.

In addition, in the high purity copper sputtering target material, the average crystal grain size is set to 70 µm or less. Thus, in the case where protrusions and recesses corresponding to crystal grains are formed on the sputter surface as sputtering proceeds, the sizes of the protrusions and recesses do not increase. Accordingly, the occurrence of the abnormal discharge can be suppressed further.

In addition, in the high purity copper sputtering target material, the Vickers hardness is set to 35 Hv or more. Thus, the crystal grain size can be retained in a relatively small size. Accordingly, the occurrence of the abnormal discharge can be suppressed even in the case where protrusions and recesses corresponding to crystal grains are formed on the sputter surface as sputtering proceeds.

In addition, since the Vickers hardness is set to 55 Hv or less, the internal strain in the crystal grain is reduced; and release of the secondary electrons in sputtering becomes uniform. Accordingly, sputtering deposition can be performed stably. Moreover, the sputtering rate being uneven due to the internal strain can be suppressed; formation of the protrusions and recesses on the sputter surface as sputtering proceeds can be suppressed; and the occurrence of the abnormal discharge can be suppressed.

Fifth Embodiment

The high purity copper sputtering target material related to the fifth embodiment of the present invention is explained below.

The use of the high purity copper sputtering target material of the present embodiment is the same as the first embodiment. Thus, descriptions thereof is omitted.

The composition of the high purity copper sputtering target material of the present embodiment is the same as the first embodiment. Thus, detailed explanations are omitted.

In the high purity copper sputtering target material of the present embodiment, an area ratio of crystals having a plane orientation of <113>±10° on a sputter surface of the target is 0.2 or less, the area ratio being obtained by EBSD measurement.

In addition, in the high purity copper sputtering target material of the present embodiment, an average crystal grain size is 70 µm or less; and a Vickers hardness is set in a range of 35 Hv or more and 55 Hv or less.

Reasons for the above-described settings of the area ratio of crystals having a plane orientation of <113>±10° on a sputter surface of the target, the average crystal grain size, and the Vickers hardness of the high purity copper sputtering target material of the present embodiment are explained below. The reason for the setting of the composition of the high purity copper sputtering target material of the present embodiment is the same as the first embodiment. Thus, detailed explanations are omitted.

(Area Ratio of Crystals Having a Plane Orientation of <113>±10° on a Sputter Surface of the Target is 0.2 or Less)

If the area ratio of crystals having a plane orientation of <113>±10° on a sputter surface of the target, the area ratio being obtained by EBSD measurement, exceeds 0.2, it is possible that the generation status of the secondary electrons in sputtering is destabilized in the region where the surface exists.

Therefore, by setting the above-described area ratio to 0.2 or less, the generation status of the secondary electrons in sputtering can be stabilized in the present embodiment.

In order to reliably stabilize the generation status of secondary electrons in sputtering, it is preferable that the above-described area ratio is set to 0.18 or less.

(Average Crystal Grain Size: 70 µm or Less)

The sputtering rate differs depending on crystal orientations. Thus, due to the above-described sputtering rate differences, protrusions and recesses corresponding to crystal grains are formed on the sputter surface as sputter proceeds.

If the average crystal grain size exceeds 70 µm, the sizes of the protrusions and recesses formed on the sputter surface are increased for the electrical charge to be concentrated on the protrusions, making it easier for the abnormal discharge to occur.

Because of the reason, the average crystal grain size is set to 70 µm or less in the high purity copper sputtering target in the present embodiment.

In order to reliably suppress the abnormal discharge by suppressing formation of the protrusions and recesses on the sputter surface as sputter proceeds, it is preferable that the average crystal grain size is set to 60 µm or less. More preferably, it is set to 50 µm or less.

(Vickers Hardness: 35 Hv or More and 55 Hv or Less)

In the high purity copper sputtering target material of the present embodiment, if the Vickers hardness exceeds 55 Hv, the internal strain in the crystal grain is increased to a higher value. In that case, there is a possibility that the generation status of secondary electrons in sputtering is destabilized; and deposition cannot be performed stably. In addition, there is a possibility that the sputtering rate becomes uneven due to the presence of the internal strain; the protrusions and recesses are formed; and the number of the micro-arc discharge increases. On the other hand, if the Vickers hardness is less than 35 Hv, the crystal grain size is coarsened. Thus, the protrusions and recessed are formed on the sputter surface as sputtering proceeds, making it easier for the abnormal discharge to occur.

Because of these reasons, the Vickers hardness is set in a range of 35 Hv or more and 55 Hv or less in the present embodiment.

In order to reliably suppress the abnormal discharge by suppressing coarsening of the crystal grain size, it is preferable that the lower limit of the Vickers hardness is set to 37 Hv or more. More preferably, it is set to 39 Hv or more. In addition, in order to reliably suppress unevenness of the film thickness and micro-arc discharge by equalizing the sputtering rate, it is preferable that the upper limit of the Vickers hardness on the sputter surface is set to 53 Hv or less. More preferably, it is set to 50 Hv or less.

Next, a method of producing a high purity copper sputtering target material, which is the present embodiment, is explained. The method of producing the high purity copper sputtering target material of the present embodiment is the same as the first embodiment. Thus, explanation of the method of producing the high purity copper sputtering target material is omitted in the present embodiment.

Hot working is performed on the obtained high purity copper ingot in the temperature range of 450-700° C. By the hot working, the casting structure is destroyed, and the structure is controlled to have equiaxed crystal grains.

Next, in order to reduce the area ratio of crystals having a plane orientation of <113>±10° on a sputter surface of the target, cold working is performed on the above-described hot forged material. In order to obtain the fine and uniform crystal grains and not to have a plane orientation biased in a specific orientation, it is effective to set a large rolling reduction rate in the cold working. By performing the cold work as explained above, recrystallization occurs easily in the subsequent heat treatment after the cold working; and the area ratio of crystal grains having a specific plane orientation is reduced. Because of this, it is preferable that the rolling reduction rate is set to 15% or more and 25% or less per single rolling pass. Moreover, it is preferable that the rolling rate over the entire rolling is set to 40% or more.

Next, the recrystallization treatment is performed to the cold worked material. It is preferable that the temperature of the heat treatment is set to 250° C. or more and 350° C. or less; and the retention time is set in the range of 1 hour or more and 2 hours or less.

area ratio of crystals having a plane orientation of <113>±10° on a sputter surface of the target may be adjusted to 0.2 or less by repeating the cold working and the heat treatment multiple times.

As explained above, the high purity copper sputtering target material of the present embodiment is produced.

The composition of the high purity copper sputtering target material of the present embodiment as configured above is the same as the first embodiment. Thus, explanation is omitted.

In addition, in the high purity copper sputtering target material of the present embodiment, the area ratio of crystals having a plane orientation of <113>±10° on a sputter surface of the target is set to 0.2 or less. Thus, the generation status of the secondary electrons in sputtering is stabilized. Accordingly, the occurrence of the abnormal discharge can be suppressed.

In addition, in the high purity copper sputtering target material, the average crystal grain size is set to 70 μm or less. Thus, in the case where protrusions and recesses corresponding to crystal grains are formed on the sputter surface as sputtering proceeds, the sizes of the protrusions and recesses do not increase. Accordingly, the occurrence of the abnormal discharge can be suppressed further.

In addition, in the high purity copper sputtering target material, the Vickers hardness is set to 35 Hv or more. Thus, the crystal grain size can be retained in a relatively small size. Accordingly, the occurrence of the abnormal discharge can be suppressed even in the case where protrusions and recesses corresponding to crystal grains are formed on the sputter surface as sputtering proceeds.

In addition, since the Vickers hardness is set to 55 Hv or less, the internal strain in the crystal grain is reduced; and release of the secondary electrons in sputtering becomes uniform. Accordingly, sputtering deposition can be performed stably. Moreover, the sputtering rate being uneven due to the internal strain can be suppressed; formation of the protrusions and recesses on the sputter surface as sputtering proceeds can be suppressed; and the occurrence of the abnormal discharge can be suppressed.

Sixth Embodiment

The high purity copper sputtering target material related to the sixth embodiment of the present invention is explained below.

The use of the high purity copper sputtering target material of the present embodiment is the same as the first embodiment. Thus, descriptions thereof is omitted.

The composition of the high purity copper sputtering target material of the present embodiment is the same as the first embodiment. Thus, detailed explanations are omitted.

In the high purity copper sputtering target material of the present embodiment, a number of molecules of a released $H_2O$ gas is $2 \times 10^{17}$/g or less, the total number of molecules of a released gas being obtained by: heating a sample collected from the target material in an ultra-high vacuum of $1 \times 10^{-7}$ Pa or less with a temperature desorption gas analyzer (TDS-MS); ionizing gas components released between 50° C. and 1000° C. by an electron impact method; and performing a composition analysis on ions formed by the ionizing with a quadrupole mass spectrometer.

In addition, in the high purity copper sputtering target material of the present embodiment, an average crystal grain size is 70 μm or less; and a Vickers hardness is set in a range of 35 Hv or more and 55 Hv or less.

Reasons for the above-described settings of the number of molecules of the released $H_2O$ gas, the average crystal grain size, and the Vickers hardness of the high purity copper sputtering target material of the present embodiment are explained below. The reason for the setting of the composition of the high purity copper sputtering target material of the present embodiment is the same as the first embodiment. Thus, detailed explanations are omitted.

(Number of Molecules of the Released $H_2O$ Gas is $2 \times 10^{17}$/g or Less)

The more strains in the crystal grain, the more defects in the crystal grains. Through the defects, $H_2O$ molecules contained in the target diffuse to the surface of the target. Such gases are released in the chamber in sputtering and the generation status of the secondary electrons in sputtering is destabilized. Therefore, if the total number of molecules of a released $H_2O$ gas exceeds $2\times10^{17}$/g, it is possible that the generation status of the secondary electrons in Ar sputtering is destabilized since there is a larger amount of gases released in the Ar atmosphere. The above-mentioned gases are gases released between 50° C. and 1000° C. in heating of a sample collected from the target material in a predetermined size in an ultra-high vacuum of $1\times10^{-7}$ Pa or less with TDS-MS.

Therefore, by setting the number of molecules of the released $H_2O$ gas from the sample in a predetermined size collected from the target material to $2\times10^{17}$/g or less, the amount of $H_2O$ gas released to the Ar gas atmosphere reduced. Accordingly, the generation status of the secondary electrons in sputtering can be stabilized.

In order to reliably stabilize the generation status of secondary electrons in sputtering, it is preferable that the above-described number of the released $H_2O$ gas is set to $1.8\times10^{17}$/g or less.

(Average Crystal Grain Size: 70 μm or Less)

The sputtering rate differs depending on crystal orientations. Thus, due to the above-described sputtering rate differences, protrusions and recesses corresponding to crystal grains are formed on the sputter surface as sputter proceeds.

If the average crystal grain size exceeds 70 μm, the sizes of the protrusions and recesses formed on the sputter surface are increased for the electrical charge to be concentrated on the protrusions, making it easier for the abnormal discharge to occur.

Because of the reason, the average crystal grain size is set to 70 μm or less in the high purity copper sputtering target in the present embodiment.

In order to reliably suppress the abnormal discharge by suppressing formation of the protrusions and recesses on the sputter surface as sputter proceeds, it is preferable that the average crystal grain size is set to 60 μm or less. More preferably, it is set to 50 μm or less.

(Vickers Hardness: 35 Hv or More and 55 Hv or Less)

In the high purity copper sputtering target material of the present embodiment, if the Vickers hardness exceeds 55 Hv, the internal strain in the crystal grain is increased to a higher value. In that case, there is a possibility that the generation status of secondary electrons in sputtering is destabilized; and deposition cannot be performed stably. In addition, there is a possibility that the sputtering rate becomes uneven due to the presence of the internal strain; the protrusions and recesses are formed; and the number of the micro-arc discharge increases. On the other hand, if the Vickers hardness is less than 35 Hv, the crystal grain size is coarsened. Thus, the protrusions and recessed are formed on the sputter surface as sputtering proceeds, making it easier for the abnormal discharge to occur.

Because of these reasons, the Vickers hardness is set in a range of 35 Hv or more and 55 Hv or less in the present embodiment.

In order to reliably suppress the abnormal discharge by suppressing coarsening of the crystal grain size, it is preferable that the lower limit of the Vickers hardness is set to 37 Hv or more. More preferably, it is set to 39 Hv or more. In addition, in order to reliably suppress unevenness of the film thickness and micro-arc discharge by equalizing the sputtering rate, it is preferable that the upper limit of the Vickers hardness on the sputter surface is set to 53 Hv or less. More preferably, it is set to 50 Hv or less.

Next, a method of producing a high purity copper sputtering target material, which is the present embodiment, is explained. The method of producing the high purity copper sputtering target material of the present embodiment is the same as the first embodiment. Thus, explanation of the method of producing the high purity copper sputtering target material is omitted in the present embodiment.

Hot working is performed on the obtained high purity copper ingot in the temperature range of 450-700° C. By the hot working, the casting structure is destroyed, and the structure is controlled to have equiaxed crystal grains.

Next, cold working is performed on the above-described hot forged material. In order to obtain the fine and uniform crystal grains and to reduce strains and defects in the crystal grain, it is effective to set a large rolling reduction rate in the cold working. By performing the cold work as explained above, recrystallization occurs easily in the subsequent heat treatment after the cold working; the strains and defects in the crystal grains are reduced; the amount of $H_2O$ diffusing on the surface through the defects in the crystal grain in sputtering is reduced; and the amount of the released $H_2O$ gas decreases. Because of this, it is preferable that the rolling reduction rate is set to 15% or more and 25% or less per single rolling pass. Moreover, it is preferable that the rolling rate over the entire rolling is set to 40% or more.

Next, the recrystallization treatment is performed to the cold worked material. It is preferable that the temperature of the heat treatment is set to 250° C. or more and 350° C. or less; and the retention time is set in the range of 2 hours or more and 3 hours or less. Diffusion of the $H_2O$ molecules contained in the target through the defects can be reduced by reducing defects in the crystal grain by reliably performing the recrystallization treatment by setting the retention time at 2 hours or more. If the retention time exceeds 3 hours, it is possible that excessive grain growth occurs by recrystallization. Therefore, it is not preferable.

The number of molecules of the released $H_2O$ gas from the sample in a predetermined size collected from the target material may be adjusted to $2\times10^{17}$/g or less by repeating the cold working and the heat treatment multiple times.

As explained above, the high purity copper sputtering target material of the present embodiment is produced.

The composition of the high purity copper sputtering target material of the present embodiment as configured above is the same as the first embodiment. Thus, explanation is omitted.

In addition, in the high purity copper sputtering target material of the present embodiment, a number of molecules of a released $H_2O$ gas is $2\times10^{17}$/g or less, the number of molecules of the released $H_2O$ gas being obtained by: heating a sample collected from the target material in an ultra-high vacuum of $1\times10^{-7}$ Pa or less with a temperature desorption gas analyzer (TDS-MS); ionizing gas components released between 50° C. and 1000° C. by an electron impact method; and performing a composition analysis on ions formed by the ionizing with a quadrupole mass spectrometer. Thus, there is less amount of the released $H_2O$ gas in sputtering and the generation status of the secondary electrons in sputtering is stabilized. Accordingly, the occurrence of the abnormal discharge can be suppressed.

In addition, in the high purity copper sputtering target material, the average crystal grain size is set to 70 μm or less. Thus, in the case where protrusions and recesses corresponding to crystal grains are formed on the sputter surface as sputtering proceeds, the sizes of the protrusions and recesses do not increase. Accordingly, the occurrence of the abnormal discharge can be suppressed further.

In addition, in the high purity copper sputtering target material, the Vickers hardness is set to 35 Hv or more. Thus, the crystal grain size can be retained in a relatively small size. Accordingly, the occurrence of the abnormal discharge can be suppressed even in the case where protrusions and recesses corresponding to crystal grains are formed on the sputter surface as sputtering proceeds.

In addition, since the Vickers hardness is set to 55 Hv or less, the internal strain in the crystal grain is reduced; and release of the secondary electrons in sputtering becomes uniform. Accordingly, sputtering deposition can be performed stably. Moreover, the sputtering rate being uneven due to the internal strain can be suppressed; formation of the protrusions and recesses on the sputter surface as sputtering proceeds can be suppressed; and the occurrence of the abnormal discharge can be suppressed.

Although the embodiments of the present invention have been described above, the present invention is not limited thereto, and can be appropriately changed without departing from the scope of the present invention.

In the present embodiment, a sputtering target for forming a high purity copper film as a wiring film has been described as an example. However, the high purity copper sputtering target material, which is an aspect of the present invention, is not limited to the specific use. Thus, the high purity copper sputtering target material can be utilized in other application.

Further, the manufacturing method is not limited to the descriptions of the present embodiments, and may be manufactured by other manufacturing methods.

EXAMPLES

Example 1

The results of the evaluation test evaluated for the high purity copper sputtering target material of the first embodiment will be described below.

Examples A1 to A7 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in the conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

The obtained high purity ingot was hot forged at 500° C.

Next, cold rolling was performed on the hot forged material at a rolling reduction rate of 20% to obtain a cold-rolled sheet with a thickness of 10 mm. The rolling reduction rate at this time was 95%.

Next, the cold working material was subjected to heat treatment at a temperature of 400° C. and a retention time of 1.5 hours.

Thereafter, the material was cut into a diameter of 125 mm and a thickness of 5 mm to obtain a high purity sputtering target material and HIP bonded with a backing plate of Cr—Zr—Cu (C18150).

Example A8 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

The obtained high purity ingot was hot forged at 500° C.

Next, cold rolling was performed on the hot forged material at a rolling reduction rate of 20%. The rolling reduction rate at this time was 80%.

Next, the cold working material was subjected to heat treatment at a temperature of 500° C. for a retention time of 2 hours.

Thereafter, the material was cut into a diameter of 125 mm and a thickness of 5 mm to obtain a high purity sputtering target material and HIP bonded with a backing plate of Cr—Zr—Cu (C18150).

Example A9 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

The obtained high purity ingot was hot forged at 500° C.

Next, cold rolling was performed on the hot forged material at a rolling reduction rate of 20%. The rolling reduction rate at this time was 95%.

Next, the cold worked material was subjected to heat treatment at a temperature of 350° C. for a retention time of 1 hour.

Thereafter, the material was cut into a diameter of 125 mm and a thickness of 5 mm to obtain a high purity sputtering target material and HIP bonded with a backing plate of Cr—Zr—Cu (C18150).

Comparative Examples

In Comparative Example A1, electrolysis was performed without adding chlorine to the electrolytic solution, and electrolysis was performed in a general room instead of a clean room. Conventional glue and ethylene glycol were used as an additive for smoothing the cathode. Dissolution casting was carried out at 1300° C. using a high purity graphite crucible in a nitrogen atmosphere at atmospheric pressure. The obtained ingot (150 mm in diameter×200 mm in height) was subjected to hot forging at 500° C. to destroy the casting structure to be equiaxed crystal, cold rolled at a rolling reduction rate of 5%, and heat treated at 400° C. for 1 hour. The rolling reduction rate at this time was 40%.

In Comparative Example A2, electrolytic refining was carried out in a general room and electrolysis was carried out using glue and ethylene glycol as an additive. Using a high purity graphite crucible, it was melted at 1300° C. in a vacuum. The obtained ingot (the same shape) was similarly subjected to hot forging at 500° C. to destroy the casting structure to be equiaxed crystals, then cold rolled at a rolling reduction rate of 10% and heat treated at 350° C. for 1 hour. The rolling reduction rate at this time was 80%.

In Comparative Example A3, electrolytic refining was carried out in a general room, and polyethylene glycol and polyvinyl alcohol were used as additives during electrolysis. Instead of vacuum melting, it was melted at 1150° C. using a high purity graphite crucible at atmospheric pressure in a nitrogen atmosphere. The obtained ingot was similarly forged, cold rolled at a rolling reduction rate of 10%, and heat-treated at 400° C. for 1 hour. The rolling reduction rate at this time was 60%.

In Comparative Example A4, it was dissolved under atmospheric pressure in a nitrogen atmosphere and melted at 1300° C. using a graphite crucible. The obtained ingot was cold-rolled at a rolling reduction rate of 10% after hot forging at 500° C. and heat-treated at 400° C. for 1 hour. The rolling reduction rate at this time was 60%.

With respect to the obtained sputtering target materials, the composition (amounts of impurities), L15°/L, the average crystal grain diameter, Vickers hardness, and the occurrence numbers of abnormal discharge frequency were evaluated by the following procedures. Evaluation results are shown in Tables 1 and 2.

(Amounts of Impurities)

Analysis of impurity elements other than O, H, N and C was carried out using a glow discharge mass spectrometer (VG-9000 type, manufactured by VG Elemental Co.). The analysis procedure was carried out according to ASTM.

O was analyzed by inert gas fusion-infrared absorption method (JIS H 1067). Specifically, analysis was carried out according to JIS Z 2613 using TCEN 600 manufactured by LECO.

Analysis of H was carried out by inert gas fusion-heat conduction method. Specifically, analysis was carried out according to JIS Z 2614 using RHEN 602 manufactured by LECO.

N was analyzed by inert gas fusion-heat conduction method. Specifically, analysis was carried out using TCEN 600 made by LECO.

The analysis of C was carried out by the combustion-infrared absorption method. Specifically, analysis was carried out according to JIS Z 2615 using CSLS 600 made by LECO.

(L15°/L)

First of all, for each sample, mechanical polishing was performed on a longitudinal section (a surface viewed in the TD direction) along the rolling direction (RD direction) using waterproof abrasive paper and diamond abrasive grains. Then, finish polishing was performed using a colloidal silica solution. For measurement, an EBSD measuring apparatus (S4300-SEM manufactured by HITACHI, OIM Data Collection manufactured by EDAX/TSL) and analysis software (OIM Data Analysis ver.5.2 manufactured by EDAX/TSL) were used. First, using a scanning electron microscope, electron beams were irradiated to individual measurement points (pixels) within the measurement range of the sample surface, and electron beams were scanned in two dimensions on the surface of the sample. Then, by azimuth analysis with the backscattered electron beam analysis, the ratio of the length of the large tilt angle grain boundaries L15°, which was the length of grain boundaries formed between adjacent crystal grains with a crystal orientation difference in a range of 15° or more and 180° or less, to the total length of grain boundaries L, which was the total length of grain boundaries formed between adjacent crystal grains with a crystal orientation difference in a range of more than 2° and 180° or less, was obtained.

(Average Crystal Grain Size)

Measurement of the average crystal grain size was carried out based on JIS H 0501:1986 (cutting method) on the rolled surface (ND surface) by microstructure observation using an optical microscope.

(Vickers Hardness)

The hardness of the sample was measured with a Macro Vickers hardness tester on the surface to be used as a target in accordance with JIS Z 2244.

(Abnormal Discharge)

The sputtering method was DC magnetron sputtering. The target to be sputtered was attached to the cathode in the chamber, and vacuum was drawn so that the ultimate vacuum was $5 \times 10^{-4}$ Pa or less. First, pre-sputtering was performed by gradually increasing the sputtering power in order to remove contamination on the target processed surface and processing flaws, and the sputtering power was increased to 3000 W. The power of the pre-sputtering was set to 660 Wh.

Subsequently, discharging and stopping for 1 minute at a sputtering power of 3000 W and a sputtering pressure of 0.4 Pa were repeated until the sputtering power reached 10 kWh. Then, the number of abnormal discharges occurred during the discharge was measured with a micro arc monitor (MAM Genesis) manufactured by Landmark Technology Co., Ltd.

TABLE 1

| | | Impurities (mass ppm) | | | | | | | | | | | | |
|---|---|---|---|---|---|---|---|---|---|---|---|---|---|---|
| | | Al | Si | Fe | S | Cl | O | H | N | C | Au, Pd, Pb | Cr, Co, Ni, Ge, Pt | Be, Ti, V, Zr, Nb, Mo, W, Th, U | Total amount of impurities excluding O, H, N, and C | Purity of copper (mass %) |
| Example of the present invention | A1 | 0.0040 | 0.048 | 0.011 | 0.010 | 0.02 | 0.4 | 0.3 | 0.1 | 0.2 | 0.002 | 0.002 | <0.001 | 0.097 | 99.999990 |
| | A2 | 0.0010 | 0.020 | 0.018 | 0.028 | 0.05 | 0.6 | 0.5 | 0.1 | 0.5 | 0.002 | 0.001 | <0.001 | 0.120 | 99.999988 |
| | A3 | 0.0020 | 0.010 | 0.009 | 0.001 | 0.09 | 0.9 | 0.5 | 0.5 | 0.1 | 0.001 | 0.002 | <0.001 | 0.115 | 99.999989 |
| | A4 | 0.0010 | 0.020 | 0.005 | 0.027 | 0.002 | 0.5 | 0.3 | 0.4 | 0.8 | 0.002 | 0.001 | <0.001 | 0.058 | 99.999994 |
| | A5 | 0.0010 | 0.020 | 0.002 | 0.005 | 0.04 | 0.2 | 0.9 | 0.8 | 0.2 | 0.002 | 0.002 | <0.001 | 0.072 | 99.999993 |
| | A6 | 0.0020 | 0.020 | 0.011 | 0.021 | 0.09 | 0.9 | 0.3 | 0.5 | 0.6 | 0.001 | 0.003 | <0.001 | 0.148 | 99.999985 |
| | A7 | 0.0045 | 0.046 | 0.018 | 0.027 | 0.09 | 0.5 | 0.5 | 0.1 | 0.3 | 0.003 | 0.002 | <0.001 | 0.191 | 99.999981 |
| | A8 | 0.0020 | 0.025 | 0.018 | 0.020 | 0.01 | 0.2 | 0.4 | 0.1 | 0.5 | 0.002 | 0.002 | <0.001 | 0.079 | 99.999992 |
| | A9 | 0.0030 | 0.010 | 0.01 | 0.005 | 0.01 | 0.2 | 0.2 | 0.1 | 0.2 | 0.001 | 0.001 | <0.001 | 0.040 | 99.999996 |

TABLE 1-continued

| | | Impurities (mass ppm) | | | | | | | | | | | | |
|---|---|---|---|---|---|---|---|---|---|---|---|---|---|---|
| | | Al | Si | Fe | S | Cl | O | H | N | C | Au, Pd, Pb | Cr, Co, Ni, Ge, Pt | Be, Ti, V, Zr, Nb, Mo, W, Th, U | Total amount of impurities excluding O, H, N, and C | Purity of copper (mass %) |
| Comparative Example | A1 | 0.0065 | 0.054 | 0.032 | 0.041 | 0.15 | 1.6 | 1.5 | 1.8 | 2 | 0.010 | 0.005 | 0.002 | 0.301 | 99.999970 |
| | A2 | 0.0070 | 0.060 | 0.030 | 0.050 | 0.02 | 0.4 | 0.3 | 0.2 | 0.3 | 0.002 | 0.001 | <0.001 | 0.170 | 99.999983 |
| | A3 | 0.0030 | 0.020 | 0.015 | 0.020 | 0.15 | 1.6 | 1.5 | 1.8 | 1.5 | 0.002 | 0.002 | <0.001 | 0.212 | 99.999979 |
| | A4 | 0.0010 | 0.040 | 0.011 | 0.020 | 0.2 | 2.1 | 2.5 | 2.0 | 2.5 | 0.002 | 0.001 | <0.001 | 0.275 | 99.999973 |

TABLE 2

| | | L15°/L | Average grain size (μm) | Vickers hardness (Hv) | Number of the abnormal discharge (times/10000 Wh) |
|---|---|---|---|---|---|
| Example of the present invention | A1 | 0.92 | 28 | 41.4 | 180 |
| | A2 | 0.81 | 26 | 40.5 | 150 |
| | A3 | 0.99 | 65 | 40.1 | 143 |
| | A4 | 0.95 | 30 | 35.1 | 190 |
| | A5 | 0.92 | 45 | 54.5 | 157 |
| | A6 | 0.94 | 68 | 40.6 | 172 |
| | A7 | 0.86 | 55 | 42.3 | 140 |
| | A8 | 0.91 | 105 | 33 | 220 |
| | A9 | 0.95 | 25 | 65 | 200 |
| Comparative Example | A1 | 0.75 | 100 | 60 | 607 |
| | A2 | 0.70 | 78 | 65 | 590 |
| | A3 | 0.72 | 50 | 58 | 720 |
| | A4 | 0.92 | 100 | 31 | 680 |

In Comparative Example A1, the amounts of impurities were high, the purity of copper was outside the range of the present invention, and the value of L15°/L was also outside the scope of the present invention, and the number of abnormal discharges was as many as 607 times.

In Comparative Example A2, the contents of Al, Si, Fe, and S were outside the scope of the present invention, and the value of L15°/L was also outside the scope of the present invention, and the number of abnormal discharges was as many as 590 times.

In Comparative Example A3, the contents of Cl, O, H, N, and C were outside the scope of the present invention, and the value of L15°/L was also outside the scope of the present invention, and the number of abnormal discharges was 720.

In Comparative Example A4, the contents of Cl, O, H, N and C were outside the scope of the present invention, and the number of abnormal discharges was as large as 680 times.

In contrast, in Examples of the present invention in which the purity of copper, the amounts of impurities, L15/L were within the range of the aspect of the present invention, the number of abnormal discharges was 190 or less.

From the above, according to Examples of the present invention, it is possible to provide a high purity copper sputtering target material capable of suppressing occurrence of abnormal discharge even when a high voltage is applied and capable of stably forming a film confirmed.

Example 2

The results of the evaluation test evaluated for the high purity copper sputtering target material of the second embodiment will be described below.

Examples B1 to B7 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in the conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

After the obtained high purity ingot was hot forged at 500° C., heat treatment with a retention time of 2 hours was performed at 600° C.

Next, cold rolling was performed on the heat treated material at a rolling reduction rate of 20% to obtain a cold-rolled sheet with a thickness of 10 mm. The rolling reduction rate at this time was 95%.

Next, the cold working material was subjected to heat treatment at a temperature of 400° C. and a retention time of 1.5 hours.

Thereafter, the material was cut into a diameter of 125 mm and a thickness of 5 mm to obtain a high purity sputtering target material and HIP bonded with a backing plate of Cr—Zr—Cu (C18150).

Example B8 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

After the obtained high purity ingot was hot forged at 500° C., heat treatment with a retention time of 2 hours was performed at 500° C.

Next, cold rolling was performed on the heat treated material at a rolling reduction rate of 20%. The rolling reduction rate at this time was 80%.

Next, the cold working material was subjected to heat treatment at a temperature of 500° C. for a retention time of 2 hours.

Thereafter, the material was cut into a diameter of 125 mm and a thickness of 5 mm to obtain a high purity sputtering target material and HIP bonded with a backing plate of Cr—Zr—Cu (C18150).

Example B9 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

After the obtained high purity ingot was hot forged at 500° C., heat treatment with a retention time of 2 hours was performed at 650° C.

Next, cold rolling was performed on the heat treated material at a rolling reduction rate of 20%. The rolling reduction rate at this time was 95%.

Next, the cold worked material was subjected to heat treatment at a temperature of 350° C. for a retention time of 1 hour.

Thereafter, the material was cut into a diameter of 125 mm and a thickness of 5 mm to obtain a high purity sputtering target material and HIP bonded with a backing plate of Cr—Zr—Cu (C18150).

Comparative Examples

In Comparative Example B1, electrolysis was performed without adding hydrochloric acid to the electrolytic solution, and electrolysis was performed in a general room instead of a clean room. Conventional glue and ethylene glycol were used as an additive for smoothing the cathode. Dissolution casting was carried out at 1300° C. using a high purity graphite crucible in a nitrogen atmosphere at atmospheric pressure. The obtained ingot (150 mm in diameter×200 mm in height) was subjected to hot forging at 500° C. to destroy the casting structure to be equiaxed crystal, cold rolled at a rolling reduction rate of 5% without performing heat treatment, and then, heat treated at 450° C. for a retention time of 1 hour. The rolling reduction rate at this time was 40%.

In Comparative Example B2, electrolytic refining was carried out in a general room and electrolysis was carried out using glue and ethylene glycol as an additive. Using a high purity graphite crucible, it was melted at 1300° C. in a vacuum (pressure $10^{-5}$ Pa). The obtained ingot (the same shape) was similarly subjected to hot forging at 500° C. to destroy the casting structure to be equiaxed crystals, then cold rolled at a rolling reduction rate of 10% without performing heat treatment, and then, heat treated at 350° C. for a retention time of 1 hour. The rolling reduction rate at this time was 80%.

In Comparative Example B3, electrolytic refining was carried out in a general room, and polyethylene glycol and polyvinyl alcohol were used as additives during electrolysis. Instead of vacuum melting, it was melted at 1150° C. using a high purity graphite crucible at atmospheric pressure in a nitrogen atmosphere. The obtained ingot was similarly forged, cold rolled at a rolling reduction rate of 10% without performing heat treatment, and then, heat-treated at 400° C. for a retention time of 1 hour. The rolling reduction rate at this time was 60%.

In Comparative Example B4, it was dissolved under atmospheric pressure in a nitrogen atmosphere and melted at 1300° C. using a graphite crucible. The obtained ingot was cold-rolled at a rolling reduction rate of 10% without performing heat treatment after hot forging at 500° C., and then, heat-treated at 400° C. for a retention time of 1 hour. The rolling reduction rate at this time was 60%.

With respect to the obtained sputtering target materials, the composition (amounts of impurities), KAM, the average crystal grain diameter, Vickers hardness, and the occurrence numbers of abnormal discharge frequency were evaluated by the following procedures. Evaluation results are shown in Tables 1 and 2.

The amounts of impurities, the average crystal grain size, Vickers hardness and the number of abnormal discharge were measured in the same manner as in Example 1.

(Measurement of KAM)

First of all, for each sample, mechanical polishing was performed on a longitudinal section (a surface viewed in the TD direction) along the rolling direction (RD direction) using waterproof abrasive paper and diamond abrasive grains. Then, finish polishing was performed using a colloidal silica solution. For measurement, an EBSD measuring apparatus (Schottkey field emission type scanning electron microscope JSM-7001F manufactured by JOEL Co., Ltd., OIM Data Collection manufactured by EDAX/TSL) and analysis software (OIM Data Analysis ver.5.2 manufactured by EDAX/TSL) were used. The accelerating voltage of the electron beam of the EBSD measuring apparatus was 15 kV, and the measurement visual field was 800 μm×1200 m. An arbitrary measurement point shape was a regular hexagon, and the average value of the orientation difference between the crystal orientations of the EBSD measurement points measured at intervals of 2.5 μm and the six EBSD measurement points adjacent to the measurement point was obtained. In the analysis, adjacent measurement points with an angular difference of 5° or more were considered to have grain boundaries between the measurement points, and were excluded when calculating the average value.

TABLE 3

| | | Impurities (mass ppm) | | | | | | | | | | | | |
|---|---|---|---|---|---|---|---|---|---|---|---|---|---|---|
| | | Al | Si | Fe | S | Cl | O | H | N | C | Au, Pd, Pb | Cr, Co, Ni, Ge, Pt | Be, Ti, V, Zr, Nb, Mo, W, Th, U | Total amount of impurities excluding O, H, N, and C | Purity of copper (mass %) |
| Example of the present invention | B1 | 0.0025 | 0.040 | 0.012 | 0.010 | 0.01 | 0.5 | 0.5 | 0.1 | 0.2 | 0.002 | 0.002 | <0.001 | 0.079 | 99.999992 |
| | B2 | 0.0031 | 0.020 | 0.01 | 0.010 | 0.01 | 0.5 | 0.5 | 0.1 | 0.3 | 0.002 | 0.001 | <0.001 | 0.056 | 99.999994 |
| | B3 | 0.0010 | 0.018 | 0.019 | 0.020 | 0.05 | 0.5 | 0.3 | 0.6 | 0.1 | 0.001 | 0.002 | <0.001 | 0.111 | 99.999989 |
| | B4 | 0.0040 | 0.022 | 0.009 | 0.025 | 0.08 | 0.4 | 0.6 | 0.1 | 0.5 | 0.002 | 0.001 | <0.001 | 0.143 | 99.999986 |
| | B5 | 0.0028 | 0.010 | 0.012 | 0.010 | 0.05 | 0.1 | 0.7 | 0.1 | 0.6 | 0.002 | 0.002 | <0.001 | 0.089 | 99.999991 |
| | B6 | 0.0014 | 0.010 | 0.015 | 0.015 | 0.05 | 0.8 | 0.8 | 0.5 | 0.7 | 0.001 | 0.003 | <0.001 | 0.095 | 99.999990 |
| | B7 | 0.0045 | 0.031 | 0.009 | 0.012 | 0.01 | 0.1 | 0.3 | 0.1 | 0.1 | 0.003 | 0.002 | <0.001 | 0.072 | 99.999993 |
| | B8 | 0.0020 | 0.010 | 0.005 | 0.015 | 0.01 | 0.1 | 0.2 | 0.6 | 0.1 | 0.002 | 0.002 | <0.001 | 0.046 | 99.999995 |
| | B9 | 0.0030 | 0.010 | 0.01 | 0.011 | 0.05 | 0.1 | 0.1 | 0.7 | 0.4 | 0.001 | 0.001 | <0.001 | 0.086 | 99.999991 |
| Comparative Example | B1 | 0.0090 | 0.100 | 0.050 | 0.100 | 0.20 | 1.5 | 1.8 | 2.0 | 2.5 | 0.010 | 0.005 | 0.002 | 0.476 | 99.999952 |
| | B2 | 0.0070 | 0.070 | 0.050 | 0.080 | 0.01 | 0.4 | 0.6 | 0.1 | 2.0 | 0.005 | 0.006 | <0.001 | 0.228 | 99.999977 |
| | B3 | 0.0060 | 0.060 | 0.040 | 0.010 | 0.20 | 1.6 | 2.0 | 1.1 | 0.2 | 0.002 | 0.008 | <0.001 | 0.326 | 99.999967 |
| | B4 | 0.0010 | 0.010 | 0.010 | 0.010 | 0.15 | 1.5 | 2.0 | 1.4 | 2.1 | 0.004 | 0.005 | 0.001 | 0.191 | 99.999981 |

TABLE 4

| | | KAM (degree) | Average grain size (μm) | Vickers hardness (Hv) | Number of the abnormal discharge (times/10000 Wh) |
|---|---|---|---|---|---|
| Example of the present invention | B1 | 1.5 | 30 | 45 | 150 |
| | B2 | 0.8 | 45 | 40 | 140 |
| | B3 | 0.5 | 55 | 46 | 181 |
| | B4 | 0.3 | 28 | 50 | 120 |
| | B5 | 0.9 | 45 | 40 | 164 |
| | B6 | 0.6 | 30 | 45 | 155 |
| | B7 | 1.1 | 35 | 44 | 171 |
| | B8 | 0.9 | 85 | 29 | 180 |
| | B9 | 0.4 | 25 | 59 | 190 |
| Comparative Example | B1 | 2.1 | 88 | 60 | 770 |
| | B2 | 1.9 | 70 | 65 | 550 |
| | B3 | 2.5 | 55 | 60 | 650 |
| | B4 | 1.0 | 195 | 28 | 800 |

In Comparative Example B1, the amounts of impurities were high, the purity of copper was outside the range of the present invention, and the value of the KAM value was also outside the scope of the present invention, and the number of abnormal discharges was as many as 770 times.

In Comparative Example B2, the contents of Al, Si, Fe, and S were outside the scope of the present invention, and the value of the KAM value was also outside the scope of the present invention, and the number of abnormal discharges was as many as 550 times.

In Comparative Example B3, the contents of Cl, O, H, and N were outside the scope of the present invention, and the value of the KAM value was also outside the scope of the present invention, and the number of abnormal discharges was 650.

In Comparative Example B4, the contents of Cl, O, H, N and C were outside the scope of the present invention, and the number of abnormal discharges was as large as 800 times.

In contrast, in Examples of the present invention in which the purity of copper, the amounts of impurities, and the KAM value were within the range of the aspect of the present invention, the number of abnormal discharges was 190 or less.

From the above, according to Examples of the present invention, it is possible to provide a high purity copper sputtering target material capable of suppressing occurrence of abnormal discharge even when a high voltage is applied and capable of stably forming a film confirmed.

Example 3

The results of the evaluation test evaluated for the high purity copper sputtering target material of the third embodiment will be described below.

Examples C1 to C7 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in the conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

After the obtained high purity ingot was hot forged at 500° C., hot rolling was performed at 500° C.

Next, cold rolling was performed on the hot rolled material at a rolling reduction rate of 20% to obtain a cold-rolled sheet with a thickness of 10 mm. The rolling reduction rate at this time was 95%.

Next, the cold working material was subjected to heat treatment at a temperature of 400° C. and a retention time of 1.5 hours.

Thereafter, the material was cut into a diameter of 125 mm and a thickness of 5 mm to obtain a high purity sputtering target material and HIP bonded with a backing plate of Cr—Zr—Cu (C18150).

Example C8 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure 10$^{-5}$ Pa). Thereafter, the mixture was poured into a mold made of high purity carbon under a vacuum state (pressure 10$^{-5}$ Pa) to prepare a high-purity copper ingot having a diameter of 150 mm×a height of 200 mm.

After the obtained high purity ingot was hot forged at 500° C., hot rolling was performed at 500° C.

Next, cold rolling was performed on the hot rolled material at a rolling reduction rate of 20%. The rolling reduction rate at this time was 80%.

Next, the cold working material was subjected to heat treatment at a temperature of 500° C. for a retention time of 2 hours.

Thereafter, the material was cut into a diameter of 125 mm and a thickness of 5 mm to obtain a high purity sputtering target material and HIP bonded with a backing plate of Cr—Zr—Cu (C18150).

Example C9 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure 10$^{-5}$ Pa). Thereafter, the mixture was poured into a mold made of high purity carbon under a vacuum state (pressure 10$^{-5}$ Pa) to prepare a high-purity copper ingot having a diameter of 150 mm×a height of 200 mm.

After the obtained high purity ingot was hot forged at 500° C., hot rolling was performed at 500° C.

Next, cold rolling was performed on the hot rolled material at a rolling reduction rate of 20%. The rolling reduction rate at this time was 95%.

Next, the cold worked material was subjected to heat treatment at a temperature of 350° C. for a retention time of 1 hour.

Thereafter, the material was cut into a diameter of 125 mm and a thickness of 5 mm to obtain a high purity sputtering target material and HIP bonded with a backing plate of Cr—Zr—Cu (C18150).

Comparative Examples

In Comparative Example C1, electrolysis was performed without adding chlorine to the electrolytic solution, and electrolysis was performed in a general room instead of a clean room. Conventional glue and ethylene glycol were used as an additive for smoothing the cathode. Dissolution casting was carried out at 1300° C. using a high purity graphite crucible in a nitrogen atmosphere at atmospheric pressure. The obtained ingot (150 mm in diameter×200 mm in height) was subjected to hot forging at 500° C. to destroy the casting structure to be equiaxed crystal, hot rolled at 500° C., cold rolled at a rolling reduction rate of 5%, and then, heat treated at 400° C. for a retention time of 1 hour. The rolling reduction rate at this time was 40%.

In Comparative Example C2, electrolytic refining was carried out in a general room and electrolysis was carried out using glue and ethylene glycol as an additive. Using a high purity graphite crucible, it was melted at 1300° C. in a vacuum. The obtained ingot (the same shape) was similarly subjected to hot forging at 500° C. to destroy the casting structure to be equiaxed crystals, hot rolled, cold rolled at a rolling reduction rate of 8%, and then, heat treated at 350° C. for a retention time of 1 hour. The rolling reduction rate at this time was 75%.

In Comparative Example C3, electrolytic refining was carried out in a general room, and polyethylene glycol and polyvinyl alcohol were used as additives during electrolysis. Instead of vacuum melting, it was melted at 1150° C. using a high purity graphite crucible at atmospheric pressure in a nitrogen atmosphere. The obtained ingot was similarly forged, hot rolled, cold rolled at a rolling reduction rate of 10%, and then, heat-treated at 500° C. for a retention time of 1 hour. The rolling reduction rate at this time was 60%.

In Comparative Example C4, it was dissolved under atmospheric pressure in a nitrogen atmosphere and melted at 1300° C. using a graphite crucible. The obtained ingot was hot rolled at 500° C., cold-rolled at a rolling reduction rate of 10% after hot forging at 500° C., and then, heat-treated at 300° C. for a retention time of 1 hour. The rolling reduction rate at this time was 60%.

With respect to the obtained sputtering target materials, the composition (amounts of impurities), the amount of released gases by TDS, the average crystal grain diameter, Vickers hardness, and the occurrence numbers of abnormal discharge frequency were evaluated by the following procedures. Evaluation results are shown in Tables 1 and 2.

The amounts of impurities, the average crystal grain size, Vickers hardness and the number of abnormal discharge were measured in the same manner as in Example 1.

(Amounts of Released Gases)

A sample was collected from the target material, the surface of the sample was polished with emery paper of #400 to #600, ultrasonically cleaned with alcohol, and dried with a dryer to obtain a sample from which the gas discharge amount was measured. The weight of the sample was 250-400 mg, and the thickness was 1-2 mm. Measurement of released gas was performed with TDS-MS (WA 1000 S/W type) manufactured by Electronic Science Co., Ltd.

The above sample was heated within an ultrahigh vacuum of 1×10$^{-7}$ Pa or less. The heating rate was 60° C./min between 50° C. and 200° C., 30° C./min between 200° C. and 1000° C., respectively. Scanning width for analysis was 1 to 200 amu. The measurement temperature range was 50° C. to 1000° C.

TABLE 5

| | | Impurities (mass ppm) | | | | | | | | | | | | |
|---|---|---|---|---|---|---|---|---|---|---|---|---|---|---|
| | | Al | Si | Fe | S | Cl | O | H | N | C | Au, Pd, Pb | Cr, Co, Ni, Ge, Pt | Be, Ti, V, Zr, Nb, Mo, W, Th, U | Total amount of impurities excluding O, H, N, and C | Purity of copper (mass %) |
| Example of the present invention | C1 | 0.0010 | 0.010 | 0.015 | 0.010 | 0.02 | 0.3 | 0.5 | 0.1 | 0.2 | 0.002 | 0.002 | <0.001 | 0.060 | 99.999994 |
| | C2 | 0.0020 | 0.010 | 0.010 | 0.020 | 0.01 | 0.5 | 0.1 | 0.1 | 0.5 | 0.002 | 0.001 | <0.001 | 0.055 | 99.999995 |
| | C3 | 0.0010 | 0.040 | 0.010 | 0.010 | 0.05 | 0.1 | 0.6 | 0.1 | 0.1 | 0.001 | 0.002 | <0.001 | 0.114 | 99.999989 |
| | C4 | 0.0040 | 0.020 | 0.010 | 0.010 | 0.08 | 0.4 | 0.7 | 0.5 | 0.6 | 0.002 | 0.001 | <0.001 | 0.127 | 99.999987 |
| | C5 | 0.0030 | 0.010 | 0.010 | 0.010 | 0.01 | 0.4 | 0.5 | 0.1 | 0.1 | 0.002 | 0.002 | <0.001 | 0.047 | 99.999995 |
| | C6 | 0.0020 | 0.010 | 0.010 | 0.010 | 0.05 | 0.5 | 0.1 | 0.1 | 0.2 | 0.001 | 0.003 | <0.001 | 0.086 | 99.999991 |
| | C7 | 0.0010 | 0.030 | 0.010 | 0.020 | 0.01 | 0.8 | 0.2 | 0.5 | 0.2 | 0.003 | 0.002 | <0.001 | 0.076 | 99.999992 |
| | C8 | 0.0010 | 0.010 | 0.014 | 0.025 | 0.01 | 0.1 | 0.5 | 0.4 | 0.5 | 0.002 | 0.002 | <0.001 | 0.064 | 99.999994 |
| | C9 | 0.0040 | 0.010 | 0.010 | 0.010 | 0.01 | 0.1 | 0.5 | 0.1 | 0.4 | 0.001 | 0.001 | <0.001 | 0.046 | 99.999995 |
| Comparative Example | C1 | 0.0090 | 0.090 | 0.050 | 0.080 | 0.2 | 2.0 | 2.5 | 0.2 | 2.1 | 0.008 | 0.009 | 0.007 | 0.453 | 99.999955 |
| | C2 | 0.0100 | 0.080 | 0.080 | 0.080 | 0.02 | 0.1 | 0.1 | 0.1 | 2.5 | 0.007 | 0.005 | <0.001 | 0.282 | 99.999972 |
| | C3 | 0.0090 | 0.070 | 0.040 | 0.001 | 0.5 | 2.0 | 2.5 | 0.4 | 0.4 | 0.005 | 0.004 | <0.001 | 0.629 | 99.999937 |
| | C4 | 0.0010 | 0.002 | 0.010 | 0.010 | 0.2 | 1.5 | 2.5 | 0.4 | 2.5 | 0.002 | 0.001 | <0.001 | 0.226 | 99.999977 |

TABLE 6

| | | Number of molecules of the released gases (×10$^{17}$ molecules/g) | Average grain size (μm) | Vickers hardness (Hv) | Number of the abnormal discharge (times/ 10000 Wh) |
|---|---|---|---|---|---|
| Example of the present invention | C1 | 2.8 | 28 | 41.4 | 120 |
| | C2 | 3.6 | 26 | 40.5 | 133 |
| | C3 | 2.2 | 65 | 40.1 | 100 |
| | C4 | 2.6 | 30 | 35.1 | 154 |
| | C5 | 3.4 | 45 | 54.5 | 130 |
| | C6 | 1.9 | 68 | 40.6 | 94 |
| | C7 | 1.0 | 55 | 42.3 | 140 |
| | C8 | 4.5 | 110 | 31.5 | 250 |
| | C9 | 3.2 | 28 | 64.0 | 220 |
| Comparative Example | C1 | 7.5 | 97 | 55.0 | 660 |
| | C2 | 8.0 | 30 | 75.0 | 820 |
| | C3 | 7.7 | 80 | 30.0 | 755 |
| | C4 | 8.9 | 30 | 60.0 | 950 |

In Comparative Example C1, the amounts of impurities were high, the purity of copper was outside the range of the present invention, and the number of the molecules of the released gases was also outside the scope of the present invention, and the number of abnormal discharges was as many as 660 times.

In Comparative Example C2, the contents of Al, Si, Fe, and S were outside the scope of the present invention, and the number of the molecules of the released gases was also outside the scope of the present invention, and the number of abnormal discharges was as many as 820 times.

In Comparative Example C3, the contents of Cl, O, H, and N were outside the scope of the present invention, and the number of the molecules of the released gases was also outside the scope of the present invention, and the number of abnormal discharges was 755.

In Comparative Example C4, the contents of Cl, O, H, N and C were outside the scope of the present invention, the number of the molecules of the released gases was also outside the scope of the present invention, and the number of abnormal discharges was as large as 950 times.

In contrast, in Examples of the present invention in which the purity of copper, the amounts of impurities, and the number of the molecules of the released gases were within the range of the aspect of the present invention, the number of abnormal discharges was 250 or less.

From the above, according to Examples of the present invention, it is possible to provide a high purity copper sputtering target material capable of suppressing occurrence of abnormal discharge even when a high voltage is applied and capable of stably forming a film confirmed.

Example 4

The results of the evaluation test evaluated for the high purity copper sputtering target material of the fourth embodiment will be described below.

Examples D1 to D7 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in the conditions shown in the embodiment to prepare a copper raw material.

The raw material produced by the above manufacturing method was placed in a crucible made of high purity carbon and dissolved in vacuum at 1130° C. (pressure 10$^{-5}$ Pa). Thereafter, the mixture was poured into a mold made of high purity carbon under a vacuum state (pressure 10$^{-5}$ Pa) to prepare a high-purity copper ingot having a diameter of 150 mm×a height of 200 mm.

After the obtained high purity ingot was hot forged at 600° C., heat treatment was performed at 850° C. for a retention time of 2 hours.

Next, cold rolling was performed on the heat treated material at a rolling reduction rate of 20% to obtain a cold-rolled sheet with a thickness of 10 mm. The rolling reduction rate at this time was 90%.

Next, the cold working material was subjected to heat treatment at a temperature of 400° C. and a retention time of 1.5 hours.

Thereafter, the material was cut into a diameter of 125 mm and a thickness of 5 mm to obtain a high purity sputtering target material and HIP bonded with a backing plate of Cr—Zr—Cu (C18150).

Example D8 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

After the obtained high purity ingot was hot forged at 550° C., heat treatment was performed at 800° C. for a retention time of 2 hours.

Next, cold rolling was performed on the heat treated material at a rolling reduction rate of 15%. The rolling reduction rate at this time was 80%.

Next, the cold working material was subjected to heat treatment at a temperature of 550° C. for a retention time of 2 hours.

Thereafter, the material was cut into a diameter of 125 mm and a thickness of 5 mm to obtain a high purity sputtering target material and HIP bonded with a backing plate of Cr—Zr—Cu (C18150).

Example D9 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure $10^{-}$Pa). Thereafter, the mixture was poured into a mold made of high purity carbon under a vacuum state (pressure $10^{-5}$ Pa) to prepare a high-purity copper ingot having a diameter of 150 mm×a height of 200 mm.

After the obtained high purity ingot was hot forged at 500° C., heat treatment was performed at 800° C. for a retention time of 1 hour.

Next, cold rolling was performed on the heat treated material at a rolling reduction rate of 20%. The rolling reduction rate at this time was 95%.

Next, the cold worked material was subjected to heat treatment at a temperature of 350° C. for a retention time of 1 hour.

Thereafter, the material was cut into a diameter of 125 mm and a thickness of 5 mm to obtain a high purity sputtering target material and HIP bonded with a backing plate of Cr—Zr—Cu (C18150).

Comparative Examples

In Comparative Example D1, electrolysis was performed without adding hydrochloric acid to the electrolytic solution, and electrolysis was performed in a general room instead of a clean room. Conventional glue and ethylene glycol were used as an additive for smoothing the cathode. Dissolution casting was carried out at 1300° C. using a high purity graphite crucible in a nitrogen atmosphere at atmospheric pressure. The obtained ingot (150 mm in diameter×200 mm in height) was subjected to hot forging at 500° C. to destroy the casting structure to be equiaxed crystal, cold rolled at a rolling reduction rate of 5% without performing heat treatment, and then, heat treated at 400° C. for a retention time of 1 hour. The rolling reduction rate at this time was 40%.

In Comparative Example D2, electrolytic refining was carried out in a general room and electrolysis was carried out using glue and ethylene glycol as an additive. Using a high purity graphite crucible, it was melted at 1300° C. in a vacuum (pressure $10^{-5}$ Pa). The obtained ingot (the same shape) was similarly subjected to hot forging at 500° C. to destroy the casting structure to be equiaxed crystals, cold rolled at a rolling reduction rate of 10% without performing heat treatment, and then, heat treated at 350° C. for a retention time of 1 hour. The rolling reduction rate at this time was 80%.

In Comparative Example D3, electrolytic refining was carried out in a general room, and polyethylene glycol and polyvinyl alcohol were used as additives during electrolysis. Instead of vacuum melting, it was melted at 1150° C. using a high purity graphite crucible at atmospheric pressure in a nitrogen atmosphere. The obtained ingot was similarly forged, cold rolled at a rolling reduction rate of 10% without performing heat treatment, and then, heat-treated at 400° C. for a retention time of 1 hour. The rolling reduction rate at this time was 60%.

In Comparative Example D4, it was dissolved under atmospheric pressure in a nitrogen atmosphere and melted at 1300° C. using a graphite crucible. The obtained ingot was hot cold-rolled at a rolling reduction rate of 10% without performing heat treatment after hot forging at 500° C., and then, heat-treated at 450° C. for a retention time of 2 hours. The rolling reduction rate at this time was 60%.

With respect to the obtained sputtering target materials, the composition (amounts of impurities), GOS, the average crystal grain diameter, Vickers hardness, and the occurrence numbers of abnormal discharge frequency were evaluated by the following procedures. Evaluation results are shown in Tables 1 and 2.

The amounts of impurities, the average crystal grain size, Vickers hardness and the number of abnormal discharge were measured in the same manner as in Example 1.

(Measurement of GOS)

First of all, for each sample, mechanical polishing was performed on a longitudinal section (a surface viewed in the TD direction) along the rolling direction (RD direction) using waterproof abrasive paper and diamond abrasive grains. Then, finish polishing was performed using a colloidal silica solution. For measurement, an EBSD measuring apparatus (Schottkey field emission type scanning electron microscope JSM-7001F manufactured by JOEL Co., Ltd., OIM Data Collection manufactured by EDAX/TSL) and analysis software (OIM Data Analysis ver.5.2 manufactured by EDAX/TSL) were used. The accelerating voltage of the electron beam of the EBSD measuring apparatus was 15 kV, and the measurement visual field was 800 µm×1200 µm. The shape of the measurement point was a regular hexagon, and the measurement interval was 2.5 µm. The average value of the local difference of the crystal orientation between one measurement point and the remaining measurement points in the identical crystal grain was determined. In the analysis, adjacent measuring points with a local orientation difference of 5° or more were considered to have grain boundaries between the measuring points and excluded when calculating the average value.

TABLE 7

| | | Impurities (mass ppm) | | | | | | | | | | | | |
|---|---|---|---|---|---|---|---|---|---|---|---|---|---|---|
| | | Al | Si | Fe | S | Cl | O | H | N | C | Au, Pd, Pb | Cr, Co, Ni, Ge, Pt | Be, Ti, V, Zr, Nb, Mo, W, Th, U | Total amount of impurities excluding O, H, N, and C | Purity of copper (mass %) |
| Example of the present invention | D1 | 0.0020 | 0.040 | 0.012 | 0.010 | 0.02 | 0.3 | 0.5 | 0.1 | 0.2 | 0.002 | 0.002 | <0.001 | 0.088 | 99.999991 |
| | D2 | 0.0020 | 0.020 | 0.010 | 0.011 | 0.01 | 0.4 | 0.3 | 0.1 | 0.3 | 0.002 | 0.001 | <0.001 | 0.056 | 99.999994 |
| | D3 | 0.0040 | 0.030 | 0.010 | 0.013 | 0.03 | 0.1 | 0.2 | 0.1 | 0.1 | 0.001 | 0.002 | <0.001 | 0.090 | 99.999991 |
| | D4 | 0.0030 | 0.020 | 0.020 | 0.019 | 0.08 | 0.3 | 0.4 | 0.1 | 0.2 | 0.002 | 0.001 | <0.001 | 0.145 | 99.999986 |
| | D5 | 0.0010 | 0.040 | 0.015 | 0.025 | 0.01 | 0.4 | 0.6 | 0.2 | 0.1 | 0.002 | 0.002 | <0.001 | 0.095 | 99.999991 |
| | D6 | 0.0020 | 0.020 | 0.010 | 0.021 | 0.02 | 0.1 | 0.4 | 0.1 | 0.3 | 0.001 | 0.003 | <0.001 | 0.077 | 99.999992 |
| | D7 | 0.0010 | 0.050 | 0.010 | 0.015 | 0.05 | 0.1 | 0.2 | 0.1 | 0.1 | 0.001 | 0.002 | <0.001 | 0.129 | 99.999987 |
| | D8 | 0.0030 | 0.010 | 0.014 | 0.014 | 0.04 | 0.1 | 0.4 | 0.1 | 0.2 | 0.002 | 0.002 | <0.001 | 0.085 | 99.999992 |
| | D9 | 0.0030 | 0.030 | 0.010 | 0.020 | 0.01 | 0.2 | 0.5 | 0.1 | 0.1 | 0.001 | 0.001 | <0.001 | 0.075 | 99.999993 |
| Comparative Example | D1 | 0.0070 | 0.080 | 0.040 | 0.050 | 0.20 | 2.0 | 1.5 | 1.1 | 2.1 | 0.010 | 0.005 | 0.002 | 0.394 | 99.999961 |
| | D2 | 0.0060 | 0.060 | 0.040 | 0.050 | 0.01 | 0.4 | 0.1 | 0.1 | 2.0 | 0.002 | 0.001 | <0.001 | 0.169 | 99.999983 |
| | D3 | 0.0055 | 0.050 | 0.025 | 0.010 | 0.20 | 1.5 | 1.2 | 1.1 | 0.1 | 0.002 | 0.002 | <0.001 | 0.294 | 99.999971 |
| | D4 | 0.0014 | 0.010 | 0.010 | 0.020 | 0.30 | 1.5 | 2.0 | 1.5 | 2.5 | 0.002 | 0.001 | <0.001 | 0.344 | 99.999966 |

TABLE 8

| | | GOS (degree) | Average grain size (μm) | Vickers hardness (Hv) | Number of the abnormal discharge (times/10000 Wh) |
|---|---|---|---|---|---|
| Example of the present invention | D1 | 1.2 | 28 | 45 | 100 |
| | D2 | 1.5 | 26 | 48 | 150 |
| | D3 | 2.0 | 65 | 38 | 180 |
| | D4 | 2.2 | 30 | 33 | 140 |
| | D5 | 1.5 | 45 | 53 | 120 |
| | D6 | 0.8 | 68 | 44 | 200 |
| | D7 | 2.8 | 55 | 42 | 160 |
| | D8 | 3.0 | 110 | 32 | 190 |
| | D9 | 1.9 | 25 | 64 | 130 |
| Comparative Example | D1 | 5.1 | 120 | 65 | 750 |
| | D2 | 4.5 | 85 | 60 | 912 |
| | D3 | 4.8 | 48 | 60 | 550 |
| | D4 | 1.7 | 110 | 30 | 850 |

In Comparative Example D1, the amounts of impurities were high, the purity of copper was outside the range of the present invention, and the GOS value was also outside the scope of the present invention, and the number of abnormal discharges was as many as 750 times.

In Comparative Example D2, the contents of Al, Si, Fe, and S were outside the scope of the present invention, and the value of the GOS value was also outside the scope of the present invention, and the number of abnormal discharges was as many as 912 times.

In Comparative Example D3, the contents of Cl, O, H, and N were outside the scope of the present invention, and the value of the GOS value was also outside the scope of the present invention, and the number of abnormal discharges was 550.

In Comparative Example D4, the contents of Cl, O, H, N and C were outside the scope of the present invention, and the number of abnormal discharges was as large as 850 times.

In contrast, in Examples of the present invention in which the purity of copper, the amounts of impurities, and the GOS value were within the range of the aspect of the present invention, the number of abnormal discharges was 200 or less.

From the above, according to Examples of the present invention, it is possible to provide a high purity copper sputtering target material capable of suppressing occurrence of abnormal discharge even when a high voltage is applied and capable of stably forming a film confirmed.

Example 5

The results of the evaluation test evaluated for the high purity copper sputtering target material of the fifth embodiment will be described below.

Examples E1 to E7 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in the conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

The obtained high purity ingot was hot forged at 550° C.

Next, cold rolling was performed on the heat treated material at a rolling reduction rate of 20% to obtain a cold-rolled sheet with a thickness of 10 mm. The rolling reduction rate at this time was 80%.

Next, the cold working material was subjected to heat treatment at a temperature of 300° C. and a retention time of 1.5 hours.

Thereafter, the material was cut into a diameter of 125 mm and a thickness of 5 mm to obtain a high purity sputtering target material and HIP bonded with a backing plate of Cr—Zr—Cu (C18150).

Example E8 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

The obtained high purity ingot was hot forged at 550° C.

Next, cold rolling was performed at a rolling reduction rate of 25%. The rolling reduction rate at this time was 80%.

Next, the cold working material was subjected to heat treatment at a temperature of 350° C. for a retention time of 2 hours.

Thereafter, the material was cut into a diameter of 125 mm and a thickness of 5 mm to obtain a high purity sputtering target material and HIP bonded with a backing plate of Cr—Zr—Cu (C18150).

Example E9 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

The obtained high purity ingot was hot forged at 500° C.

Next, cold rolling was performed at a rolling reduction rate of 15%. The rolling reduction rate at this time was 95%.

Next, the cold worked material was subjected to heat treatment at a temperature of 250° C. for a retention time of 1 hour.

Thereafter, the material was cut into a diameter of 125 mm and a thickness of 5 mm to obtain a high purity sputtering target material and HIP bonded with a backing plate of Cr—Zr—Cu (C18150).

Comparative Examples

In Comparative Example E1, electrolysis was performed without adding hydrochloric acid to the electrolytic solution, and electrolysis was performed in a general room instead of a clean room. Conventional glue and ethylene glycol were used as an additive for smoothing the cathode. Dissolution casting was carried out at 1300° C. using a high purity graphite crucible in a nitrogen atmosphere at atmospheric pressure. The obtained ingot (150 mm in diameter×200 mm in height) was subjected to hot forging at 500° C. to destroy the casting structure to be equiaxed crystal, cold rolled at a rolling reduction rate of 5%, and then, heat treated at 500° C. for a retention time of 1 hour. The rolling reduction rate at this time was 40%.

In Comparative Example E2, electrolytic refining was carried out in a general room and electrolysis was carried out using glue and ethylene glycol as an additive. Using a high purity graphite crucible, it was melted at 1300° C. in a vacuum (pressure $10^{-5}$ Pa). The obtained ingot (the same shape) was similarly subjected to hot forging at 500° C. to destroy the casting structure to be equiaxed crystals, cold rolled at a rolling reduction rate of 10%, and then, heat treated at 350° C. for a retention time of 1 hour. The rolling reduction rate at this time was 80%.

In Comparative Example E3, electrolytic refining was carried out in a general room, and polyethylene glycol and polyvinyl alcohol were used as additives during electrolysis. Instead of vacuum melting, it was melted at 1150° C. using a high purity graphite crucible at atmospheric pressure in a nitrogen atmosphere. The obtained ingot was similarly forged, cold rolled at a rolling reduction rate of 10%, and then, heat-treated at 400° C. for a retention time of 1 hour. The rolling reduction rate at this time was 60%.

In Comparative Example E4, it was dissolved under atmospheric pressure in a nitrogen atmosphere and melted at 1300° C. using a graphite crucible. The obtained ingot was cold-rolled at a rolling reduction rate of 10% t after hot forging at 500° C., and then, heat-treated at 450° C. for a retention time of 2 hours. The rolling reduction rate at this time was 60%.

With respect to the obtained sputtering target materials, the composition (amounts of impurities), the area ratio of crystals having a plane orientation of <113>±10° on a sputter surface of the target, the average crystal grain diameter, Vickers hardness, and the occurrence numbers of abnormal discharge frequency were evaluated by the following procedures. Evaluation results are shown in Tables 1 and 2.

The amounts of impurities, the average crystal grain size, Vickers hardness and the number of abnormal discharge were measured in the same manner as in Example 1.

(Area Ratio of Crystals Having a Plane Orientation of <113>±10° on a Sputter Surface of the Target)

First of all, for each sample, mechanical polishing was performed on a longitudinal section (a surface viewed in the TD direction) along the rolling direction (RD direction) using waterproof abrasive paper and diamond abrasive grains. Then, finish polishing was performed using a colloidal silica solution. For measurement, an EBSD measuring apparatus (Schottkey field emission type scanning electron microscope JSM-7001F manufactured by JOEL Co., Ltd., OIM Data Collection manufactured by EDAX/TSL) and analysis software (OIM Data Analysis ver.5.2 manufactured by EDAX/TSL) were used. The accelerating voltage of the electron beam of the EBSD measuring apparatus was 15 kV, and the measurement visual field was 800 µm×1200 µm. The data obtained by the EBSD measuring apparatus was processed using analysis software to determine the area ratio of the crystal having the plane orientation of <113>±10° in the sputter surface of the target.

TABLE 9

| | | Impurities (mass ppm) | | | | | | | | | | | | |
|---|---|---|---|---|---|---|---|---|---|---|---|---|---|---|
| | | Al | Si | Fe | S | Cl | O | H | N | C | Au, Pd, Pb | Cr, Co, Ni, Ge, Pt | Be, Ti, V, Zr, Nb, Mo, W, Th, U | Total amount of impurities excluding O, H, N, and C | Purity of copper (mass %) |
| Example of the present invention | E1 | 0.0010 | 0.020 | 0.010 | 0.010 | 0.02 | 0.5 | 0.5 | 0.1 | 0.1 | 0.002 | 0.002 | <0.001 | 0.065 | 99.99999 |
| | E2 | 0.0020 | 0.010 | 0.005 | 0.020 | 0.01 | 0.5 | 0.1 | 0.1 | 0.1 | 0.002 | 0.002 | <0.001 | 0.051 | 99.99999 |
| | E3 | 0.0010 | 0.010 | 0.010 | 0.010 | 0.02 | 0.1 | 0.5 | 0.1 | 0.5 | 0.001 | 0.002 | <0.001 | 0.054 | 99.99999 |
| | E4 | 0.0020 | 0.030 | 0.010 | 0.040 | 0.01 | 0.5 | 0.6 | 0.1 | 0.5 | 0.002 | 0.001 | <0.001 | 0.095 | 99.99999 |
| | E5 | 0.0030 | 0.030 | 0.010 | 0.010 | 0.01 | 0.4 | 0.5 | 0.1 | 0.5 | 0.002 | 0.002 | <0.001 | 0.067 | 99.99999 |
| | E6 | 0.0020 | 0.010 | 0.010 | 0.010 | 0.05 | 0.5 | 0.1 | 0.1 | 0.2 | 0.002 | 0.002 | <0.001 | 0.086 | 99.99999 |
| | E7 | 0.0010 | 0.010 | 0.010 | 0.020 | 0.01 | 0.5 | 0.5 | 0.5 | 0.5 | 0.002 | 0.002 | <0.001 | 0.055 | 99.99999 |
| | E8 | 0.0010 | 0.020 | 0.050 | 0.020 | 0.01 | 0.1 | 0.5 | 0.5 | 0.4 | 0.002 | 0.002 | <0.001 | 0.105 | 99.99999 |
| | E9 | 0.0030 | 0.030 | 0.010 | 0.010 | 0.01 | 0.1 | 0.5 | 0.1 | 0.2 | 0.002 | 0.004 | <0.001 | 0.069 | 99.99999 |
| Comparative Example | E1 | 0.0100 | 0.100 | 0.300 | 0.100 | 0.3 | 2.0 | 2.0 | 0.2 | 3.0 | 0.010 | 0.01 | 0.005 | 0.835 | 99.99992 |
| | E2 | 0.0100 | 0.080 | 0.100 | 0.080 | 0.02 | 0.1 | 0.1 | 0.1 | 2.5 | 0.007 | 0.005 | <0.001 | 0.302 | 99.99997 |
| | E3 | 0.0010 | 0.020 | 0.010 | 0.001 | 0.5 | 2.0 | 2.5 | 0.5 | 0.4 | 0.004 | 0.004 | <0.001 | 0.540 | 99.99995 |
| | E4 | 0.0010 | 0.002 | 0.010 | 0.010 | 0.2 | 1.5 | 2.0 | 0.2 | 3.0 | 0.002 | 0.001 | <0.001 | 0.226 | 99.99998 |

TABLE 10

| | | Area ratio of crystals having a plane orientation of <113> ± 10° on a sputter surface of the target | Average grain size (μm) | Vickers hardness (Hv) | Number of the abnormal discharge (times/10000 Wh) |
|---|---|---|---|---|---|
| Example of the present invention | E1 | 0.15 | 31 | 40 | 130 |
| | E2 | 0.10 | 35 | 46 | 121 |
| | E3 | 0.18 | 55 | 35 | 124 |
| | E4 | 0.14 | 31 | 45 | 105 |
| | E5 | 0.09 | 39 | 47 | 105 |
| | E6 | 0.14 | 48 | 41 | 114 |
| | E7 | 0.13 | 45 | 43 | 140 |
| | E8 | 0.18 | 60 | 31 | 225 |
| | E9 | 0.17 | 27 | 66 | 286 |
| Comparative Example | E1 | 0.25 | 89 | 45 | 660 |
| | E2 | 0.28 | 45 | 75 | 770 |
| | E3 | 0.30 | 70 | 30 | 851 |
| | E4 | 0.21 | 75 | 60 | 934 |

In Comparative Example E1, the amounts of impurities were high, the purity of copper was outside the range of the present invention, and the area ratio of crystals having a plane orientation of <113>±10° on a sputter surface of the target was also outside the scope of the present invention, and the number of abnormal discharges was as many as 660 times.

In Comparative Example E2, the contents of Al, Si, Fe, S, and C were outside the scope of the present invention, and the value of the area ratio of crystals having a plane orientation of <113>±10° on a sputter surface of the target was also outside the scope of the present invention, and the number of abnormal discharges was as many as 770 times.

In Comparative Example E3, the contents of Cl, O, H, and N were outside the scope of the present invention, and the value of the area ratio of crystals having a plane orientation of <113>+±10 on a sputter surface of the target was also outside the scope of the present invention, and the number of abnormal discharges was 851.

In Comparative Example E4, the contents of Cl, O, H, N and C were outside the scope of the present invention, the area ratio of crystals having a plane orientation of <113>±10° on a sputter surface of the target was also outside of the scope of the present invention, and the number of abnormal discharges was as large as 934 times.

In contrast, in Examples of the present invention in which the purity of copper, the amounts of impurities, and the area ratio of crystals having a plane orientation of <113>±10° on a sputter surface of the target were within the range of the aspect of the present invention, the number of abnormal discharges was 286 or less.

From the above, according to Examples of the present invention, it is possible to provide a high purity copper sputtering target material capable of suppressing occurrence of abnormal discharge even when a high voltage is applied and capable of stably forming a film confirmed.

Example 6

The results of the evaluation test evaluated for the high purity copper sputtering target material of the sixth embodiment will be described below.

Examples F1 to F7 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in the conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

After the obtained high purity ingot was hot forged at 550° C., cold rolling was performed at a rolling reduction rate of 20% to obtain a cold-rolled sheet with a thickness of 10 mm. The rolling reduction rate at this time was 70%.

Next, the cold working material was subjected to heat treatment at a temperature of 300° C. and a retention time of 2.5 hours.

Thereafter, the material was cut into a diameter of 125 mm and a thickness of 5 mm to obtain a high purity sputtering target material and HIP bonded with a backing plate of Cr—Zr—Cu (C18150).

Example F8 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

After the obtained high purity ingot was hot forged at 550° C., cold rolling was performed at a rolling reduction rate of 20%.

The rolling reduction rate at this time was 80%.

Next, the cold working material was subjected to heat treatment at a temperature of 350° C. for a retention time of 3 hours.

Thereafter, the material was cut into a diameter of 125 mm and a thickness of 5 mm to obtain a high purity sputtering target material and HIP bonded with a backing plate of Cr—Zr—Cu (C18150).

Example F9 of the Present Invention

Electrolytic copper having 1 mass ppm or less of Al, 1 mass ppm or less of Si, 1 mass ppm or less of Fe, and 20 mass ppm or less of other impurities (excluding O, H, N and C) was used as a raw material. Electrolytic refining was performed in conditions shown in the embodiment to prepare a copper raw material.

The raw material produced by the above manufacturing method was placed in a crucible made of high purity carbon and dissolved in vacuum at 1130° C. (pressure $10^{-5}$ Pa). Thereafter, the mixture was poured into a mold made of high purity carbon under a vacuum state (pressure $10^{-5}$ Pa) to prepare a high-purity copper ingot having a diameter of 150 mm×a height of 200 mm.

After the obtained high purity ingot was hot forged at 550° C., cold rolling was performed at a rolling reduction rate of 20%. The rolling reduction rate at this time was 90%.

Next, the cold worked material was subjected to heat treatment at a temperature of 250° C. for a retention time of 2 hours.

Thereafter, the material was cut into a diameter of 125 mm and a thickness of 5 mm to obtain a high purity sputtering target material and HIP bonded with a backing plate of Cr—Zr—Cu (C18150).

Comparative Examples

In Comparative Example F1, electrolysis was performed without adding hydrochloric acid to the electrolytic solution, and electrolysis was performed in a general room instead of a clean room. Conventional glue and ethylene glycol were used as an additive for smoothing the cathode. Dissolution casting was carried out at 1300° C. using a high purity graphite crucible in a nitrogen atmosphere at atmospheric pressure. The obtained ingot (150 nm in diameter×200 mm in height) was subjected to hot forging at 500° C. to destroy the casting structure to be equiaxed crystal, cold rolled at a rolling reduction rate of 5%, and then, heat treated at 450° C. for 1 hour. The rolling reduction rate at this time was 40%.

In Comparative Example F2, electrolytic refining was carried out in a general room and electrolysis was carried out using general glue and ethylene glycol as an additive. Using a high purity graphite crucible, it was melted at 1300° C. in a vacuum (pressure $10^{-5}$ Pa). The obtained ingot (the same shape) was similarly subjected to hot forging at 500° C. to destroy the casting structure to be equiaxed crystals, cold rolled at a rolling reduction rate of 10%, and then, heat treated at 150° C. for 1 hour. The rolling reduction rate at this time was 80%.

In Comparative Example F3, electrolytic refining was carried out in a general room, and polyethylene glycol and polyvinyl alcohol were used as additives during electrolysis. Instead of vacuum melting, it was melted at 1150° C. using a high purity graphite crucible at atmospheric pressure in a nitrogen atmosphere. The obtained ingot was similarly forged, cold rolled at a rolling reduction rate of 10%, and then, heat-treated at 400° C. for 2 hours. The rolling reduction rate at this time was 60%.

In Comparative Example F4, it was dissolved under atmospheric pressure in a nitrogen atmosphere and melted at 1300° C. using a graphite crucible. The obtained ingot was hot, cold-rolled at a rolling reduction rate of 10% after hot forging at 500° C., and then, heat-treated at 400° C. for 3 hours. The rolling reduction rate at this time was 60%.

With respect to the obtained sputtering target materials, the composition (amounts of impurities), the amount of released $H_2O$ gas by TDS, the average crystal grain diameter, Vickers hardness, and the occurrence numbers of abnormal discharge frequency were evaluated by the following procedures. Evaluation results are shown in Tables 1 and 2.

The amounts of impurities, the average crystal grain size, Vickers hardness and the number of abnormal discharge were measured in the same manner as in Example 1.

(Amounts of Released $H_2O$ Gas)

A sample was collected from the target material, the surface of the sample was polished with emery paper of #400 to #600, ultrasonically cleaned with alcohol, and dried with a dryer to obtain a sample from which the gas discharge amount was measured. The weight of the sample was 250-400 mg, and the thickness was 1-2 mm. Measurement of released gas was performed with TDS-MS (WA 1000 S/W type) manufactured by Electronic Science Co., Ltd.

The above sample was heated within an ultrahigh vacuum of $1\times10^{-7}$ Pa or less. The heating rate was 60° C./min between 50° C. and 200° C., 30° C./min between 200° C. and 1000° C., respectively. Scanning width for analysis was 1 to 200 m/z. The measurement temperature range was 50° C. to 1000° C. Signals having the m/z value of 18 were taken as one corresponding to $H_2O$ molecules. Based on the relationship between the ionic strength and the detection time obtained by the measurement, the number of the released $H_2O$ molecules were obtained (m is the molecular weight of $H_2O$, and z is the ionized charge by the ion source of TDS-MS, which is 1).

the number of the molecules of the released $H_2O$ gas was also outside the scope of the present invention, and the number of abnormal discharges was as many as 660 times.

In Comparative Example F3, the contents of Al, Si, Fe, Cl, O, and H were outside the scope of the present invention, and the number of the molecules of the released $H_2O$ gas was also outside the scope of the present invention, and the number of abnormal discharges was 750.

In Comparative Example F4, the contents of Cl, O, H and C were outside the scope of the present invention, the number of the molecules of the released $H_2O$ gas was also outside the scope of the present invention, and the number of abnormal discharges was as large as 804 times.

In contrast, in Examples of the present invention in which the purity of copper, the amounts of impurities, and the number of the molecules of the released $H_2O$ gas were

TABLE 11

| | | Impurities (mass ppm) | | | | | | | | | | | | |
|---|---|---|---|---|---|---|---|---|---|---|---|---|---|---|
| | | Al | Si | Fe | S | Cl | O | H | N | C | Au, Pd, Pb | Cr, Co, Ni, Ge, Pt | Be, Ti, V, Zr, Nb, Mo, W, Th, U | Total amount of impurities excluding O, H, N, and C | Purity of copper (mass %) |
| Example of the present invention | F1 | 0.0200 | 0.020 | 0.020 | 0.01 | 0.07 | 0.8 | 0.6 | 0.1 | 0.8 | 0.005 | 0.005 | 0.001 | 0.151 | 99.99998 |
| | F2 | 0.0010 | 0.020 | 0.010 | 0.02 | 0.05 | 0.4 | 0.2 | 0.2 | 0.5 | 0.001 | 0.005 | <0.001 | 0.107 | 99.99999 |
| | F3 | 0.0020 | 0.010 | 0.010 | 0.01 | 0.01 | 0.1 | 0.3 | 0.1 | 0.5 | 0.008 | 0.004 | <0.001 | 0.054 | 99.99999 |
| | F4 | 0.0030 | 0.010 | 0.010 | 0.01 | 0.01 | 0.5 | 0.1 | 0.1 | 0.6 | 0.008 | 0.006 | <0.001 | 0.057 | 99.99999 |
| | F5 | 0.0020 | 0.040 | 0.005 | 0.01 | 0.01 | 0.2 | 0.2 | 0.1 | 0.1 | 0.001 | 0.005 | <0.001 | 0.073 | 99.99999 |
| | F6 | 0.0010 | 0.020 | 0.004 | 0.02 | 0.01 | 0.1 | 0.2 | 0.1 | 0.1 | 0.004 | 0.005 | <0.001 | 0.064 | 99.99999 |
| | F7 | 0.0040 | 0.010 | 0.010 | 0.01 | 0.01 | 0.1 | 0.3 | 0.4 | 0.2 | 0.020 | 0.005 | <0.001 | 0.069 | 99.99999 |
| | F8 | 0.0020 | 0.020 | 0.010 | 0.02 | 0.01 | 0.2 | 0.6 | 0.4 | 0.4 | 0.002 | 0.005 | <0.001 | 0.069 | 99.99999 |
| | F9 | 0.0010 | 0.020 | 0.010 | 0.01 | 0.01 | 0.1 | 0.1 | 0.1 | 0.3 | 0.001 | 0.004 | <0.001 | 0.056 | 99.99999 |
| Comparative Example | F1 | 0.0100 | 0.150 | 0.200 | 0.08 | 0.20 | 3.0 | 2.5 | 0.2 | 2.5 | 0.020 | 0.020 | 0.004 | 0.684 | 99.99993 |
| | F2 | 0.0100 | 0.090 | 0.050 | 0.08 | 0.02 | 0.1 | 0.1 | 0.1 | 3 | 0.010 | 0.005 | <0.001 | 0.265 | 99.99997 |
| | F3 | 0.0100 | 0.090 | 0.070 | 0.02 | 0.40 | 2.0 | 2.5 | 0.5 | 0.1 | 0.020 | 0.005 | <0.001 | 0.615 | 99.99994 |
| | F4 | 0.0020 | 0.002 | 0.010 | 0.01 | 0.20 | 3.0 | 2.0 | 0.2 | 2.5 | 0.002 | 0.001 | <0.001 | 0.227 | 99.99998 |

TABLE 12

| | | Number of molecules of the released $H_2O$ gas ($\times 10^{17}$ molecules/g) | Average grain size (μm) | Vickers hardness (Hv) | Number of the abnormal discharge (times/10000 Wh) |
|---|---|---|---|---|---|
| Example of the present invention | F1 | 1.5 | 45 | 36 | 120 |
| | F2 | 1.2 | 38 | 46 | 110 |
| | F3 | 1.4 | 60 | 48 | 130 |
| | F4 | 1.1 | 55 | 41 | 104 |
| | F5 | 1.5 | 45 | 45 | 115 |
| | F6 | 1.3 | 43 | 38 | 120 |
| | F7 | 1.4 | 50 | 43 | 145 |
| | F8 | 1.2 | 80 | 32 | 184 |
| | F9 | 1.3 | 27 | 55 | 175 |
| Comparative Example | F1 | 2.6 | 77 | 46 | 680 |
| | F2 | 2.4 | 35 | 74 | 660 |
| | F3 | 2.6 | 65 | 35 | 750 |
| | F4 | 2.5 | 75 | 40 | 804 |

In Comparative Example F1, the amounts of impurities were high, the purity of copper was outside the range of the present invention, and the number of the molecules of the released $H_2O$ gas was also outside the scope of the present invention, and the number of abnormal discharges was as many as 680 times.

In Comparative Example F2, the contents of Al, Si, Fe, S, and C were outside the scope of the present invention, and within the range of the aspect of the present invention, the number of abnormal discharges was 184 or less.

From the above, according to Examples of the present invention, it is possible to provide a high purity copper sputtering target material capable of suppressing occurrence of abnormal discharge even when a high voltage is applied and capable of stably forming a film confirmed.

INDUSTRIAL APPLICABILITY

A miniaturized and thinned wiring film made of copper can be formed efficiently and stably. As a result, a flat panel display, a touch panel, or the like of a high quality semiconductor device, liquid crystal, organic EL panel, or the like can be produced even more efficiently.

What is claimed is:

1. A high purity copper sputtering target material comprising Cu at a purity of 99.99998 mass % or more excluding O, H, N and C, wherein
    an Al content is 0.005 mass ppm or less,
    a Si content is 0.05 mass ppm or less,
    an Fe content is 0.02 mass ppm or less,
    a S content is 0.03 mass ppm or less,
    a Cl content is 0.1 mass ppm or less,
    an O content is 1 mass ppm or less,
    a H content is 1 mass ppm or less,
    a N content is 1 mass ppm or less,
    a C content is 1 mass ppm or less, and
    a value of L15°/L is 0.8 or more, L being a total length of grain boundaries formed between adjacent crystal grains with a crystal orientation difference in a range of more than 2° and 180° or less, and L15° being a length of large tilt angle grain boundaries formed between adjacent crystal grains with a crystal orientation difference in a range of 15° or more and 180° or less.

2. The high purity copper sputtering target material according to claim 1, wherein a local orientation difference of crystal orientations obtained by a crystal orientation measurement by an electron backscattering diffraction is 1.5° or less.

3. The high purity copper sputtering target material according to claim 1, wherein a total number of molecules of a released gas is $5 \times 10^{17}$/g or less, the total number of molecules of a released gas being obtained by: heating a sample collected from the target material in an ultra-high vacuum of $1 \times 10^{-7}$ Pa or less with a temperature desorption gas analyzer (TDS-MS); ionizing gas components released between 50° C. and 1000° C. by an electron impact method; and performing a composition analysis on ions formed by the ionizing with a quadrupole mass spectrometer.

4. The high purity copper sputtering target material according to claim 1, wherein an average value of local orientation differences between one measurement point and all of other measurement points in an identical crystal grain is 4° or less, the average value being obtained by a crystal orientation measurement with an electron backscattering diffraction.

5. The high purity copper sputtering target material according to claim 1, wherein an area ratio of crystals having a plane orientation of <113>±10° on a sputter surface of the target is 0.2 or less, the area ratio being obtained by a crystal orientation measurement with an electron backscattering diffraction.

6. The high purity copper sputtering target material according to claim 1, wherein a number of molecules of a released $H_2O$ gas is $2 \times 10^{17}$/g or less, the number of molecules of a $H_2O$ gas being obtained by: heating a sample collected from the target material in an ultra-high vacuum of $1 \times 10^{-7}$ Pa or less with a temperature desorption gas analyzer (TDS-MS); ionizing gas components released between 50° C. and 1000° C. by an electron impact method; and performing a composition analysis on ions formed by the ionizing with a quadrupole mass spectrometer.

7. The high purity copper sputtering target material according to claim 1, wherein a Vickers hardness is set in a range of 35 Hv or more and 55 Hv or less.

* * * * *